(12) United States Patent
Smith et al.

(10) Patent No.: US 6,172,009 B1
(45) Date of Patent: Jan. 9, 2001

(54) CONTROLLED CONVERSION OF METAL OXYFLUORIDES INTO SUPERCONDUCTING OXIDES

(75) Inventors: John A. Smith, Nashua, NH (US); Michael J. Cima, Winchester; Neville Sonnenberg, Newton, both of MA (US)

(73) Assignee: Massachusetts Institute of Technology, Cambridge, MA (US)

(*) Notice: Under 35 U.S.C. 154(b), the term of this patent shall be extended for 0 days.

(21) Appl. No.: 09/470,926

(22) Filed: Dec. 22, 1999

Related U.S. Application Data

(62) Division of application No. 08/878,058, filed on Jun. 18, 1997.

(51) Int. Cl.$^7$ .............. H01L 39/24; B05D 5/12
(52) U.S. Cl. .......... 505/473; 505/500; 505/474; 505/475; 505/477; 505/742; 505/446; 505/447
(58) Field of Search ................... 505/473, 500, 505/446, 447, 474, 475, 477, 742; 427/62

(56) References Cited

U.S. PATENT DOCUMENTS

| | | |
|---|---|---|
| 4,931,425 | 6/1990 | Kimura et al. |
| 5,225,561 | 7/1993 | Kirlin et al. |
| 5,231,074 | 7/1993 | Cima et al. |
| 5,280,012 | 1/1994 | Kirlin et al. |
| 5,296,460 | 3/1994 | Wessels et al. |
| 5,319,118 | 6/1994 | Norman et al. |
| 5,453,494 | 9/1995 | Kirlin et al. |
| 5,603,983 | 2/1997 | Clough et al. |

FOREIGN PATENT DOCUMENTS

WO 96/32201   10/1996  (WO).

OTHER PUBLICATIONS

Chan et al. "Effect of the Post–Deposition Processing Ambient on the Preparation of Superconducting YBa$_2$Cu$_3$O$_{7-x}$ Coevaporated Thin Films Using a BaF$_2$ Source" *Appl. Phys. Lett.* 53(15):1443 (Oct. 1988).

McIntyre et al. "The Effects of Substrate Surface Steps on the Microstructure of Epitaxial YBa$_2$Cu$_3$O$_{7-x}$ Thin Films on (001) LaAlO$_3$"*J. Cryst. Growth* 149:64 (Jan. 1995).

McIntyre et al. "Heteroepitaxial Growth of Chemically Derived ex situ Ba$_2$YCu$_3$O$_{7-x}$ Thin Films" *J. Mater. Res.* 9(9):2219 (Sep. 1994).

P.C. McIntyre and M.J. Cima "Epitaxial Nucleation and Growth of Chemically Derived Ba$_2$YCu$_3$O$_{7-x}$ Thin Films on (001) SrTiO$_3$" *J. Appl. Phys.* 77(10):5263 (May, 1995).

(List continued on next page.)

*Primary Examiner*—Ray V. King
(74) *Attorney, Agent, or Firm*—Clark & Elbing LLP; Mary Rose Scozzafava

(57) ABSTRACT

An oxide superconductor article is provided having an oxide superconductor film having a thickness of greater than 0.5 microns disposed on a substrate, said article having a transport critical current density ($J_c$) of greater than or equal to about $10^5$ A/cm$^2$ at 77 K, zero field. The oxide superconductor film is characterized by high $J_c$ and high volume percent of c-axis epitaxial oxide grains, even with thicknesses of up to 1 micron. The oxide superconductor article is prepared by providing a metal oxyfluoride film, said metal oxyfluoride film comprising the constituent metallic elements of an oxide superconductor in substantially stoichiometric proportions; and converting the metal oxyfluoride into the oxide superconductor at a rate of conversion selected by adjusting a reaction parameter selected from the group consisting of temperature, $P_{H2O}$, $P_{O2}$, and time and combinations thereof, such that an oxide superconductor film having a transport critical current density of greater than or equal to about $10^5$ A/cm$^2$ at 77 K, zero field is obtained.

24 Claims, 14 Drawing Sheets

OTHER PUBLICATIONS

Gupta et al. "Superconducting Oxide Films with High Transition Temperature Prepared from Metal Trifluoroacetate Precursors" *Appl. Phys. Lett.* 52(24):2077 (Jun. 1988).

Cima et al. "Metalorganic Deposition of High-$J_c$ $Ba_2YCu_3O_{7-x}$ Thin Films on Single Crystal Substrates" Proceedings of the Material Research Society, No Year and Page Data!

Hashimoto et al. "Microwave Plasma CVD of Oxide Films Relating to High-$T_c$ Bi-Sr-Ca-Cu-O Sperconductor" *Mol. Cryst. Liq. Cryst.* 184:207 (1990).

Doctoral Dissertation of Paul C. McIntyre "Heteroepitaxy Growth of Chemically Derived $Ba_2YCu_3O_{7-x}$ Thin Films", Massachusetts Institute of Technology. Jun. 1993.

Mankiewich et al, High-Temperature Superconductivity vol. 1, 1986–1988, pp. 18a–18g, 1989.*

Mankiewich et al, Appl. Phys. Lett. vol. 51, No. 21, pp. 1753–1755. Nov. 1987.*

Freenstra et al, J. Appl. Phys. 69(9), pp. 6569–6576, May 1991.*

Fisanick, et al., "Microstructural characterization of $Ba_2YCu_xO_7$ films produced by coevaporation", Proceedings Symposium, Materials Research Society, Boston, MA, Nov. 30$^{th}$, –Dec. 4$^{th}$, 1987, pp. 703–706 (1988) Abstract Only.

He, et al.,"Deposition of biaxially–oriented metal and oxide buffer–layer films on textured Ni tapes: new substrates for high–current, high–temperature superconductors", *Physica C*275 (Mar. , 1997) pp. 155–161.

Obaldia et al., "Coexistence of grains with differing orthohombicity in high quality $YBa_2 Cu_3O_{7-\delta}$ thin films", *Appl. Phys. Lett.*65(26) ( Dec., 1994) pp. 3395–3397.

Berkowitz et al., "Increased transition temperature in in situ coevaporated $YBa_2YCu_3O_{7-\delta}$ thin films by low temperature post–annealing", *Appl. Phys. Lett.*65(12) (Sep., 1994) pp. 1587–1589.

Mankiewich et al., High Critical–Current Density $Ba_sYCu_3O_1$Thin Films Produced By Covaporation of Y, Cu an $BaF_2$, High Temperature Superconductivity, vol. 1, 1986–1988, pp. 18a–18g.

Mankiewich, et al., "Preparation and Processing of Thin Film $Ba_2YCu_3O_7$, "High Temperature Superconductivity vol. 1, 1986–1988, pp. 17a–17q.

Mankiewich, et al., "Reproducible Technique For Fabrication of Thin Films of High Transition Temperature superconductors, "High Temperature Superconductivity vol. 1, 1986–1988, pp. 19a–19c.

* cited by examiner

CONTROLLED CONVERSION OF METAL OXYFLUORIDES INTO SUPERCONDUCTING OXIDES

CROSS REFERENCE TO RELATED APPLICATIONS

This application is a divisional of and claims priority from U.S. patent application No. 08/878,058, filed Jun. 18, 1997.

FIELD OF THE INVENTION

This invention relates to highly oriented oxide superconducting films. The invention further relates to processing of metal oxide- and metal fluoride-containing films into oxide superconductor films.

BACKGROUND OF THE INVENTION

The discovery of superconducting ceramic oxides has fueled a tremendous effort to fabricate these oxides into high performance films and coatings. High temperature superconducting (HTSC) film fabrication methods can be largely divided into two areas: physical and chemical methods.

Physical methods include reactive evaporation, magnetron sputtering, e-beam deposition and laser ablation. While physical deposition methods form high quality films, these deposition techniques typically have very slow formation rates, and require high vacuum environments so that they require expensive equipment. In addition, the techniques are best suited for thin-film fabrication. For these reasons, physical deposition methods are extremely difficult to scale up to multi-meter lengths required for electrical or magnetic applications.

Chemical methods are largely based upon thermally activated chemical reactions of precursor compounds during film formation. Chemical film fabrication methods involve a precursor which is deposited onto a substrate and later transformed through thermal and chemical means to a film having the desired composition and phase.

Films may be prepared using metalorganic chemical vapor deposition (MOCVD), in which precursor films are deposited from metalorganic precursors having a high vapor pressure. Metal-organic solution deposition (MOD) processes involve the deposition of a precursor film from a condensed phase precursor. The precursor film is then heated and converted into the final ceramic in a separate heat treatment.

MOD processes are widely used in industry for the deposition of ceramic films. The process is ideally suited for the rapid, inexpensive deposition of films on large or continuous substrates. Other advantages of the MOD process include easy control of metal composition and homogeneity, short processing time, low capital equipment cost and low precursor cost.

Typically in MOD processes, metal carboxylates of carboxylic acids, alkoxides, or partially hydrolyzed alkoxides are dissolved in organic solvents and the resultant solution is deposited onto a substrate by dipping or spin coating. The precursor films produced by these coating processes are transformed into metal compound-containing coatings by heat treatment, which most commonly includes a series of distinct heating steps. While chemical methods represent versatile and inexpensive methods of film fabrication with potential for high speed production, they are very sensitive to secondary reactions which may be deleterious to final superconducting properties. For example, in the deposition of materials such as $YBa_2Cu_3Oy$, such processes are highly susceptible to the intermediate formation of barium carbonate ($BaCO_3$). The stability of $BaCO_3$ requires high processing temperatures (>900° C.) and extended processing times in order to decompose the barium carbonate and obtain the oxide superconductor. The extreme reaction conditions result in film reaction with the substrate, poor texture of the oxide superconductor and incomplete formation of the oxide superconductor phase.

Chan et al. in *Appl. Phys. Lent.* 53(15):1443 (October 1988) discloses a hybrid process, known as an ex situ process, which includes the physical deposition of a precursor film which is then processed outside of the physical deposition chamber by conventional chemicothermal processes. This PVD process ($BaF_2$ ex situ process) separates the deposition and conversion steps. This process involves codeposition of $CuO$, $Y_2O_3$, and $BaF_2$ in the correct stoichiometric uniformly on the substrate. The film is then converted under conventional heating conditions into the oxide superconductor by annealing in the presence of water vapor. The limitations of physical deposition methods described above remain, however. Chan et al observed that improved electrical performance was obtained by increasing the $P_{O2}$ and decreasing the $P_{HF}$ during the anneal step.

Cima et al. in U.S. Pat. No. 5,231,074, report the MOD preparation of $Ba_2YCu_3O_{7-x}$, (YBCO) oxide superconductor films having improved electrical transport properties by MOD using metal trifluoroacetates on single crystal $SrTiO_3$ and $LaAlO_3$. The films of a thickness of about 0.1 $\mu$m possessed critical transition temperatures of about 90 K and zero field critical current densities of greater than $10^6$ A/cm$^2$ at 77 K.

In addition, the superconducting performance of epitaxial $Ba_2YCu_3O_{7-x}$ films prepared using the process described in U.S. Pat. No. 5,231,074 has been found to depend on film thickness. Electrical performance drops off dramatically as film thickness increases from 0.1 $\mu$m to 1.0 $\mu$m. Although thinner films have routinely been prepared with critical current densities greater than $10^6$ A/cm$^2$, application of conventional chemical processing techniques in the preparation of films with a thickness near 1.0 $\mu$m never yielded results close to this level of performance. For example, a MOD process using metal trifluoroacetates has been used to prepare thin (70–80 nm) $YBa_2Cu_3O_y$ (YBCO) films (where y is a value sufficient to impart superconductivity at temperatures of at least 77 K) with $T_c$>92 K and $J_c$>5×10$^6$ A/cm$^2$ (77 K, self field); however, it has not been possible to prepare much thicker films possessing similar properties. Indeed, prior to the development of the processing techniques described in this patent application no solution-based deposition process had been demonstrated that produced high $J_c$ films with thicknesses of over 0.5 $\mu$m.

Thicker oxide superconductor coatings are needed in any application requiring high current carrying capability such as power transmission and distribution lines, transformers, fault current limiters, magnets, motors and generators. Thicker oxide superconducting films are desired to achieve a high engineering (or effective) critical current ($J_e$), that is, the total current carrying capability divided by the total cross sectional area of the conductor including the substrate.

It is desirable that oxide superconducting coatings greater than 0.5 $\mu$m in thickness have high critical current densities. There is a need for fabrication techniques which may be used to prepared these thick oxide superconductor films and coatings with superior electrical performances.

SUMMARY OF THE INVENTION

It is an object of the invention to provide oxide superconductor films having superior electrical properties.

It is a further object of the invention to provide oxide superconductor thick films possessing high epitaxial alignment, and preferably c-axis epitaxial alignment.

It is another object of the present invention to provide a method of processing metal oxyfluoride precursor films into high quality oxide superconductor films.

It is a further object of the invention to provide a method of fabrication for high quality relatively thick film oxide superconductors.

These and other objects of the invention are accomplished by controlling the reaction kinetics for the conversion of the metal oxyfluoride into an oxide superconductor, so that the rate of conversion takes place at a desired controlled rate. In particular, reaction conditions are selected which control the rate of consumption of $BaF_2$ and/or other metal fluorides and thus the HF evolution rate which among other effects permits sufficient time for the transport of HF from the film and which also reduces the HF concentration during the nucleation of the oxide superconductor layer at the substrate/film interface. In particular, the reaction temperature and the moisture content of the processing gas used in the reaction are controlled so as to adjust the conversion rate of the metal oxyfluoride into the oxide superconductor.

The present invention is applicable to any chemical processing system which generates hydrogen fluoride upon hydrolysis in the preparation of a metal oxide. The presence of fluoride in the precursor film may have the additional advantageous effect of doping the product oxide superconductor with fluorine which had been demonstrated to increase its critical transition temperature and, hence, possibly its critical current density. The present invention may be applied to any film fabrication method which consumes barium fluorides or other metal fluorides during deposition and processing.

By "metal oxyfluoride" as that term is used herein it is meant a composition which contains metals, oxides and fluorides. The composition may include cationic metallic species bound to both oxygen and fluoride, e.g., $MO_xF_y$, where x and y are selected to satisfy metal valency, or it may include a mixture of metal oxides and metal fluorides, e.g., $MO_x$ and $MF_y$.

"Moisture content" as that term is used herein, refers to the vol % water vapor contained in the processing gas used in the heat treatment of the invention at the point of its introduction into the furnace and may alternatively be referred to as $P_{H2O}$ or relative humidity (RH). Relative humidity may be referred to relative to a particular temperature since the capacity of the processing gas to contain water vapor is temperature-dependent. Moisture content is defined herein in terms of relative humidity (RH), which represents the amount of water (%) in the processing gas relative to the amount of water in the processing gas at maximum capacity (saturation) at the point of its introduction into the furnace at room temperature (RT).

By "coated conductor" as that term is used herein, it is meant, a superconducting wire or tape in which the superconducting material is coated on the exterior of a substrate that forms the bulk of the wire or tape, or other article.

In one aspect of the invention, a method for preparing an oxide superconductor film includes providing a metal oxyfluoride film on a substrate, said metal oxyfluoride film having a thickness greater than or equal to about 0.5 μm and comprising the constituent metallic elements of an oxide superconductor in substantially stoichiometric proportions; and converting the metal oxyfluoride into the oxide superconductor at a rate of conversion selected by adjusting a reaction parameter selected from the group consisting of temperature, $P_{H2O}$ and combinations thereof, such that an oxide superconductor film having a transport critical current density of greater than or equal to about $10^5$ A/cm$^2$ at 77 K, zero field is obtained.

In another aspect of the invention, an oxide superconductor film is prepared by providing a metal oxyfluoride film on a substrate, said metal oxyfluoride film comprising the constituent metallic elements of an oxide superconductor in substantially stoichiometric proportions; and converting the metal oxyfluoride into the oxide superconductor in a processing gas having a moisture content of less than about 100% RH as determined at 25° C.

In yet another aspect of the invention, an oxide superconductor film is prepared by providing a metal oxyfluoride film, said metal oxyfluoride film comprising the constituent metallic elements of an oxide superconductor in substantially stoichiometric proportions; and converting the metal oxyfluoride into the oxide superconductor under reaction conditions selected to provide an atmosphere above the substrate comprising an HF concentration at a level to provide an oxide superconductor film having a transport critical current density of greater than or equal to about $10^5$ A/cm$^2$ at 77 K, zero field.

In yet another aspect of the invention, an oxide superconductor film is prepared by (a) providing a metal oxyfluoride film on a substrate, said metal oxyfluoride film comprising the constituent metallic elements of an oxide superconductor in substantially stoichiometric proportions; (b) converting the metal oxyfluoride into the oxide superconductor in a processing gas having a moisture content of less than 100% RH as determined at 25° C. for a time sufficient to form a layer of the oxide superconductor at the substrate/film interface; and (c) completing conversion of the metal oxyfluoride into the oxide superconductor in a processing gas having a moisture content greater than that in step (b). In preferred embodiments, a time sufficient to form a layer of the oxide superconductor at the substrate/film interface is in the range of about 15 minutes to about 2 hour.

In preferred embodiments, the moisture content comprises a relative humidity less than about 95%, and preferably less than about 50%, and more preferably less than about 1–3% as determined at 25° C. The substrate may comprise a metal or a ceramic, wherein the ceramic is selected from the group consisting of $SrTiO_3$, $LaAlO_3$, zirconia, preferably stabilized zirconia, MgO and $CeO_2$. The substrate may be substantially lattice-matched with the oxide superconductor. In other preferred embodiments, the methods above further comprise annealing the oxide superconductor film so as to oxygenate the oxide superconductor.

In other preferred embodiments, conditions for converting the metal oxyfluoride comprise heating the metal oxyfluoride film in a processing gas having a moisture content of less than about 95–100% RH as determined at 25° C. and at a temperature in the range of 700–900° C., or heating in an environment where oxygen content is selected to be as low as possible at a given temperature while still maintaining stability of the oxide superconductor phase.

In preferred embodiments, the metal oxyfluoride film is deposited using a technique selected from the group consisting of MOD, MOCVD, reactive evaporation, plasma spray, molecular beam epitaxy, laser ablation, ion-beam sputtering and e-beam evaporation, or by depositing a metal trifluoroacetate coating onto the substrate and decomposing the metal trifluoroacetate coating to form the metal oxyfluoride film. Multiple layers may be applied. In preferred embodiments, the oxide superconductor film preferably has a thickness of greater than or equal to 0.8 microns ($\mu$m), and more preferably has a thickness of greater than or equal to 1.0 micron ($\mu$m).

In another aspect of the invention, an oxide superconductor article is provided in which an oxide superconductor film has a thickness of greater than 0.5 microns ($\mu$m) disposed on a substrate and the article has a transport critical current density ($J_c$) of greater than or equal to about $10^5$ A/cm$^2$ at 77 K, in zero applied magnetic field.

In yet another aspect of the invention, a coated conductor article, is provided including a metallic core; a buffer layer disposed on the core; and an oxide superconductor coating having a thickness greater than or equal to about 0.5 $\mu$m, said crystalline buffer layer substantially lattice-matched with the oxide superconductor, said coated conductor exhibiting a critical current density of greater than or equal to about $10^5$ A/cm$^2$ at 77 K, self field.

The article may be further characterized in that the article possesses a critical transition temperature ($T_c$) of greater than 92 K. The article may be further characterized in that the oxide superconductor comprises a sufficiently high volume percent of c-axis epitaxy so as to provide $J_c$ values of equal to or greater than $10^5$ A/cm$^2$ at 77 K, in zero applied magnetic field. The article may be further characterized in that the oxide superconductor comprises residual fluoride so as to provide $T_c$ values greater than 92 K.

In preferred embodiments, the oxide superconductor coating has a thickness greater than or equal to about 0.8 $\mu$m and more preferably greater than or equal to about 1.0 $\mu$m. In other preferred embodiments. the conductor has a critical current density of greater than or equal to about $10^6$ A/cm$^2$ at 77 K, self field. In other preferred embodiments, the oxide superconductor is characterized by a high degree of c-axis epitaxy.

In yet another aspect of the invention, an oxide superconductor article is provided including an oxide superconductor film having a thickness of greater than 0.5 microns ($\mu$m) disposed on a substrate, said oxide superconductor being substantially c-axis epitaxially aligned.

BRIEF DESCRIPTION OF THE DRAWING

The invention is described with reference to the Figures, which are presented for the purpose of illustration only and are in no way limiting of the invention, and in which.

DETAILED DESCRIPTION OF THE INVENTION

Figure 1:
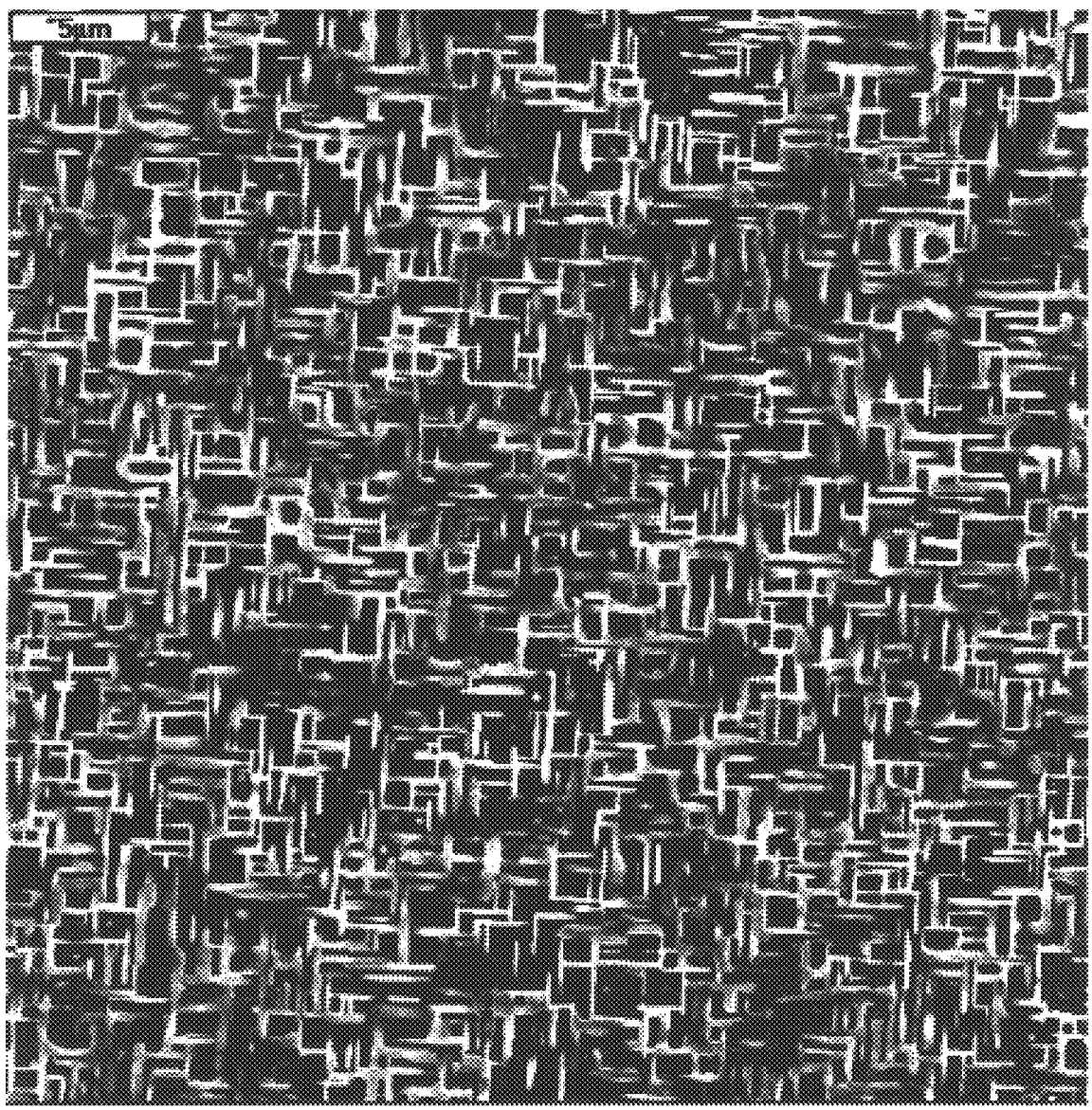
FIG. 1 is a photomicrograph of the surface of a prior art oxide superconductor film.

The present invention recognizes that improved electrical transport properties of the invention may be achieved by processing the metal oxyfluoride film into an oxide superconductor under reaction conditions which control the reaction kinetics of the process and the microstructure of the resultant oxide film. In particular, reaction conditions are selected which control the rate of consumption of BaF$_2$ and/or other metal fluorides and thus the HF evolution rate which among other effects permits sufficient time for the transport of HF from the film and which also reduces the HF concentration during the nucleation of the oxide superconductor layer at the substrate/film interface.

The present invention further recognizes that it is possible to convert the metal oxyfluoride film into an oxide superconductor film under processing conditions which will provide a highly oriented film with high critical current density. According to the method of the invention, temperature and $P_{H2O}$ conditions are selected and applied as described herein during the step of conversion of the metal oxyfluoride into an oxide superconductor to provide an oxide superconductor film having a thickness of greater than or equal to 0.5 micron ($\mu$m), preferably greater than or equal to 0.8 micron ($\mu$m) and most preferably greater than or equal to 1.0 micron ($\mu$m), and a critical current density of at least $10^5$ A/cm$^2$ and preferably at least $10^6$ A/cm$^2$. The oxide superconductor may be further characterized as having substantial c-axis epitaxy, characterized by a significant absence of any a-axis aligned grains.

It has been observed that films which are described in the prior art possess high angle grain boundaries. High angle grain boundaries represent 90° misoriented crystals on the film surface, which are deleterious to high critical current density. Critical current densities of films with many high angle grain boundaries are less than optimal because of the weak link behavior at each local grain boundary. These weak links are superconducting only when very small amounts of current are passed through them. They become resistive, however, when current is increased. High angle grain boundaries typically occur where there is roughly equal probability for both c-axis and a-axis orientation on the substrate. Thicker films, in particular, are prone to extended growth of a-axis oriented grains, which grow rapidly toward the film surface. The present invention provides a film where the amount of high angle grain boundaries is significantly reduced over prior art films and thus represents a significant improvement over prior art oxide superconductor films.

The present invention provides oxide superconducting thick films, e.g., >0.5 $\mu$m which demonstrate high critical current densities. The inventive oxide superconductor films are characterized by high c-axis epitaxy of the oxide superconductor grains with the substrate and by a high critical current density, such as greater than $10^5$ A/cm$^2$, and preferably greater than about $10^6$ A/cm$^2$. By c-axis epitaxy, as that term is used herein, it is meant that the principle axes of the substrate and film are arranged such that the c-axis of the oxide superconductor is normal to the substrate surface. The other principle axes of the oxide superconductor, a and b (a only at high temperatures), are also aligned with respect to the principle axes of the substrate. Thus, within the oxide superconductor layer, the a, b and c axes are aligned. Similarly, by a-axis epitaxy, as that term is used herein, it is meant that the principle axes of the substrate and film are arranged such that the a-axis of the oxide superconductor is normal to the substrate surface. The other principle axes are aligned with substrate. In preferred embodiments, the films are characterized by a significant or majority of c-axis epitaxy and little a-axis epitaxy of the oxide grains. Note that c-axis epitaxy is defined for an oxide grain. The actual orientation of the oxide superconductor a and b axes with respect to the respective axes of the substrate may vary from grain to grain with no significant effect on current carrying properties.

Figure 2:
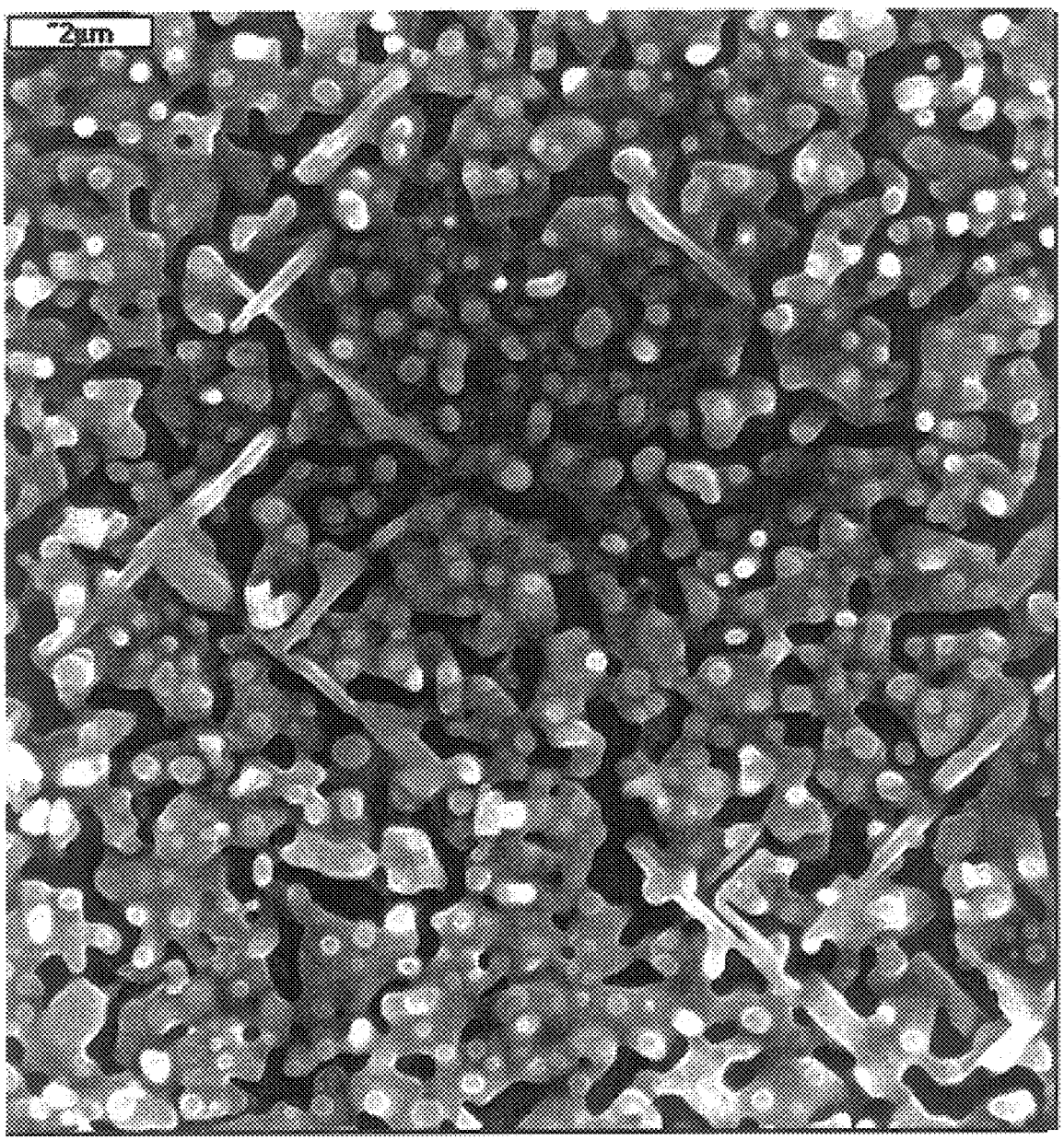
FIG. 2 is a photomicrograph of the surface of an oxide superconductor film prepared according to the method of the invention.

This is clearly demonstrated by comparison of the films of the prior art with those of the present invention, as seen in FIGS. 1 and 2, respectively. FIG. 1 is a photomicrograph of the surface of an 0.8 μm thick oxide superconductor film prepared according to prior art by heating a metal oxyfluoride film in a water-saturated, 0.03% oxygen environment at 835° C. The film had a $J_c$ of $1.6 \times 10^4$ A/cm². The mosaic of a-axis epitaxial grains creates a network of 90 degree, i.e., high angle grain boundaries, which are known to drastically decrease critical current density of the film. The volume fraction of a-axis epitaxial grains in the film is substantial.

In contrast, the oxide superconductor films of the present invention exhibit significantly less a-axis epitaxy of the oxide superconductor grains, as is shown in FIG. 2. FIG. 2 is a photomicrograph of a 1.0 micron (μm) thick oxide superconductor film of the invention which was heated in a 1.2% RH, 0.1% $O_2$ environment at 785° C. This film is characterized by substantial c-axis epitaxy of the oxide superconductor crystalline grains normal to the substrate surface. c-axis epitaxy is demonstrated by the substantial absence of "edge-on" a-axis, epitaxially-aligned oxide grains which create a mosaic or basket weave pattern on the film surface. Instead, c-axis epitaxy allows the plate-like grains to lie flat in the plane of the substrate surface. The film exhibits a critical transition temperature of greater than 90 K, and a critical current density ($J_c$) of at least $10^6$ A/cm². Significantly, the film possesses these superconducting properties even with a film thickness of 1.0 μm.

The invention includes superconducting coatings and films made with any oxide superconductor, such as by way of example only, oxide superconductors of the rare earth-barium-cuprate family of superconductors (ReBCO), where Re=rare earth elements, such as Y, Nd, Pr, the bismuth-strontium-calcium-cuprate family of superconductors (BSCCO), the thallium-strontium-calcium-barium-cuprate (TBSCCO) and the mercury-barium-strontium-calcium-cuprate (HBSCCO) family of superconductors. In preferred embodiments, the method is practiced using the oxide superconductor $Ba_2YCu_3O_y$ (YBCO), where y is a value sufficient to impart superconductivity at temperatures of at least 77 K.

The substrate used in the preparation of the coated conductor article may be any substrate which is not deleteriously affected by the processing conditions and chemicals used to prepare the oxide superconductor. The substrate may be of any shape or structure. It may be flat or three-dimensional and it may be in any shape, such as by way of example, in the form of tapes, wires, ribbons and sheets. The substrate may be single crystalline ceramic, or polycrystalline ceramic or metal, or other material. In demonstrated embodiments, the substrate is a ceramic crystalline material which is lattice matched with the oxide superconductor.

Lattice-matched substrates are single crystal or polycrystalline ceramic materials having similar crystalline lattice constants as the oxide superconductor. Suitable substrates include,. but are in no way limited to, $SrTiO_3$, $LaAlO_3$, zirconia, preferably stabilized zirconia, such as yttria-stabilized zirconia (YSZ), $CeO_2$, and MgO. Other suitable substrates include textured and untextured polycrystalline metal substrates of the appropriate lattice constant. In embodiments using metal substrates, it may be desirable to use a buffer layer between the substrate and the oxide superconductor layer. Suitable buffer layers include but are not limited to, zirconia, preferably IBAD YSZ, $LaAlO_3$, $SrTiO_3$, $CeO_2$ and MgO.

Figure 3:
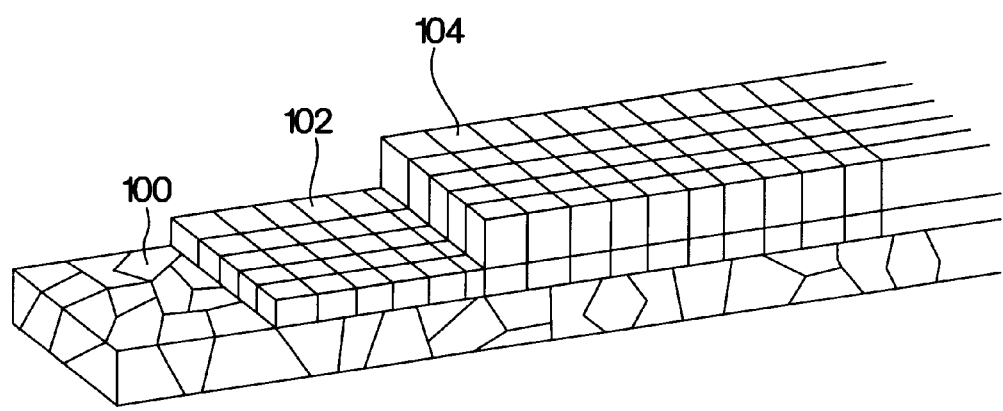
FIG. 3 is an illustration of a coated conductor of the invention.

In another embodiment of the invention, coated conductor articles are contemplated in which each layer imparts a desired property to the article. For instance, the base substrate may be a metallic substrate selected for durability and/or flexibility; and the base substrate may be coated with a buffer layer which is compatible with the oxide superconductor. This geometry is particularly well suited for use as a coated superconductor wire or tape. With reference to FIG. 3, a coated wire may comprise a metallic core 100. Suitable core materials include, but are not limited to steel, nickel, nickel alloys and alloys of copper, iron and molybdenum. The core optionally may be lattice-matched to the oxide superconductor. Alternatively, the core may be deformation textured. The core 100 is coated with a buffer layer 102 which contains some degree of crystallographic alignment and which is reasonably lattice-matched with the oxide superconductor. The buffer layer 102 has an epitaxial oxide superconductor layer 104 deposited thereon. The oxide superconductor layer desirably has a thickness in the range of greater than or equal to 0.5 microns (μm), preferably greater than or equal to 0.8 microns (μm) and most preferably greater than or equal to 1.0 microns (μm).

Figure 4:
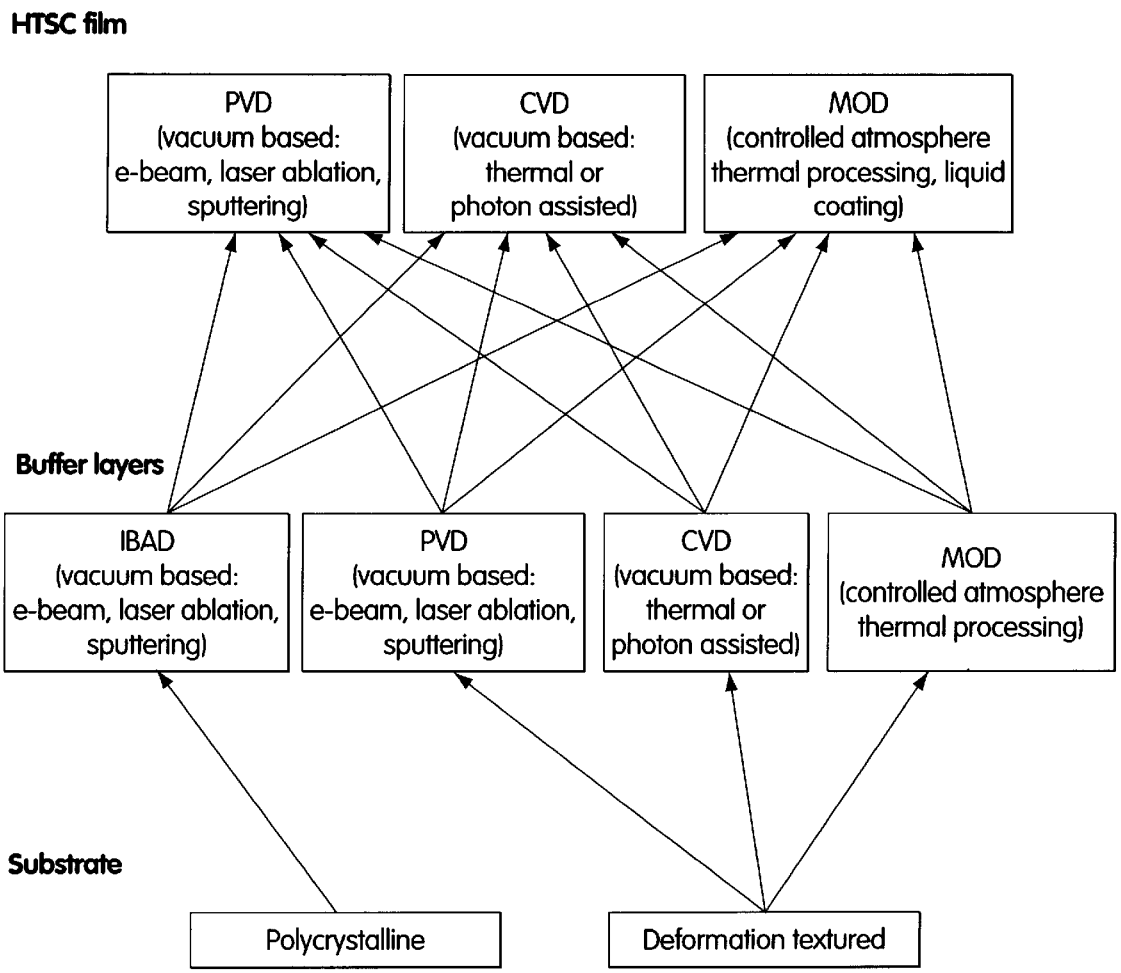
FIG. 4 is a flow diagram of the various fabrication processes which may be used to prepare a coated conductor.

The coated conductor may be fabricated using the methods described herein for the processing of a high quality thick film oxide superconductor layer. The coated conductor may be prepared using a variety of processing techniques, such as are set forth in FIG. 4.

The preparation of oxide superconductor films according to the method of the invention is described with reference to YBCO; however, it is recognized that these principles may be applied to the manufacture of anv oxide superconductor. In one embodiment, the oxide superconductor YBCO films of the present invention may be prepared using solutions of metal-trifluoroacetate (TFA) salts of the constituent metals, Ba, Y and Cu. These salts are soluble in organic solvents such as esters, ethers and alcohols.

The TFA solution is deposited on the substrate. Coating may be accomplished by many known coating methods, including but not limited to, spinning, spraying, painting or dipping the substrate into the precursor solution. Oxide films may be fabricated on substrates having a varied geometry including flat and three dimensional substrates, such as ribbons, wires, coil geometries, and patterned geometries. Substrates may be polycrystalline substrates or single crystal ceramic substrates lattice-matched to the oxide superconductor or they may be non-lattice matched. The present invention is particularly suited for the use of lattice-matched substrates in the formation of epitaxially-alianed oxide superconductor films. The nucleating oxide superconductor preferentially aligns its principle axes with the principle axes of the substrate to thereby obtain ordered crystal growth and orientation of the oxide film (epitaxy). Such order results in an oxide superconductor in which each axis is substantially completely aligned. The precursor may be applied in a single step or in multiple steps sufficient to provide an oxide superconductor film havingy a final thickness of at least 0.5 microns.

The TFA precursor is decomposed at low temperatures (e.g., <400° C.) to form an inter-mediate metal oxyfluoride compound. Fluoride is typically present in the film as barium fluoride ($BaF_2$), although other metal fluorides which do not include barium may be present, such as by way of example, $YF_3$. Because of the similarity of the intermediate metal oxyfluoride film to physically deposited films, e.g., electron beam coevaporated films of $BaF_2$, $Y_2O_3$, and CuO (Chan et al., supra), it is contemplated that metal oxyfluoride films prepared by PVD processes may also be treated in accordance to the method of the invention.

Metal oxyfluoride films maybe converted into the tetragonal YBCO phase by reaction in a moist oxidizing atmosphere. The initial step is believed to be the reaction of the metal oxyfluoride precursor with water to form the corresponding metal oxides (CuO, BaO and $Y_2O_3$) and $HF_{(g)}$. The HF is removed from the film by diffusion to the film surface and transport from the film in the processing gas flowing, over the film. The final oxide superconductor film is desirably substantially free from fluoride; however, it may be desirable that dopant levels of fluoride remain in the film. The presence of dopant levels of fluoride in oxide superconductors is known to increase the critical transition temperature and critical current density of the film. See, Doctoral Dissertation of Paul C. McIntyre, Massachusetts Institute of Technology, June, 1993, entitled "Heteroepitaxial Growth of Chemically Derived $Ba_2YCu_3O_{7-x}$ Thin Films". Critical transition temperatures of greater than 92 K have been observed.

Concurrent with and/or subsequent to the removal of the fluoride from the film, the tetragonal YBCO phase forms and nucleates in the film. Thus, the overall reactions taking, place in the film are shown in eqs (1) and (2),

$$BaF_2 + H_2O_{(g)} \rightarrow BaO + 2HF_{(g)} \quad (1)$$

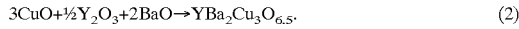

$$3CuO + \tfrac{1}{2}Y_2O_3 + 2BaO \rightarrow YBa_2Cu_3O_{6.5}. \quad (2)$$

Figure 5:
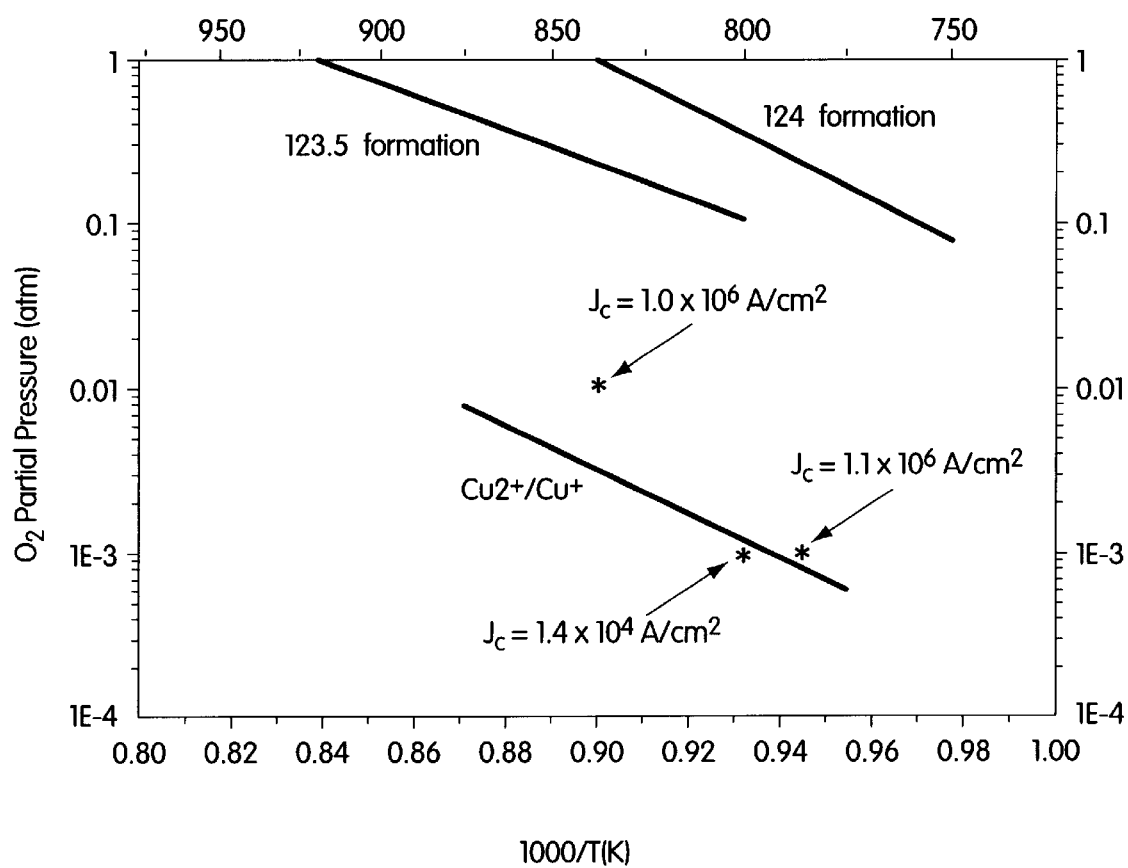
FIG. 5 is a plot of $P_{O2}$ vs. 1000/T(K) demonstrating the Cu$^{2+}$/CU$^+$ stability line for the formation of YBCO oxide superconductor.

YBCO preferentially forms at the substrate surface, which enables its alignment with the substrate. The formation of YBCO preferentially occurs at a $P_{O2}$ and temperature that is above the stability line 50 for the $Cu^{2+}/Cu^+$ reduction, as shown in FIG. 5 (adapted from R. Beyers and B. T. Ahn, *Superconducting Ceramics—Proc. XII Winter Meeting on Low Temperature Physics* (Progress in High Temperature Superconductivity, Vol. 31), eds. J. L. Heiras, L. E. Sansores, A. A. Valladares; World Scientific Publishing, Singapore, 1991; p. 55). If conditions are below this line, i.e., reducing conditions, $Cu^{2+}$ will be reduced and material other than YBCO will form. However, if conditions are too far above this line. e.g., too oxidizing, then material other than YBCO (123) will form such as YBCO (124) or YBCO (123.5). Additionally, processing near the stability line 50 may increase the amount of transient liquid present during nucleation and growth of YBCO (123) and thereby result in films with higher density. (See, U.S. Pat. No. 5,231,074.)

The YBCO phase nucleates and grows throughout the entire thickness of the metal oxyfluoride film. This nucleation and growth process takes place after or simultaneous with the removal of fluoride from the film by a hydrolysis reaction which generates HF and BaO. In order for the resultant oxide film to maintain an epitaxy with the substrate, it is believed desirable for the YBCO phase first to nucleate at the film/substrate interface and for that transformation to continue upward towards the film surface.

The present invention recognizes that it is possible to convert the metal oxyfluoride film into an oxide superconductor film under conditions which will provide a highly oriented epitaxial film with high critical current density. According to the method of the invention, temperature and $P_{H2O}$ conditions are selected and applied as described herein during the step of conversion of the metal oxyfluoride into an oxide superconductor to provide an oxide superconductor film having a thickness of greater than or equal to 0.5 micron ($\mu$m), preferably greater than or equal to 0.8 micron ($\mu$m) and most preferably greater than or equal to 1.0 micron ($\mu$m), and a critical current density of at least $10^5$ A/cm$^2$ and preferably at least $10^6$ A/cm$^2$. The oxide superconductor may be further characterized as having substantial c-axis epitaxial alignment, characterized by a significant absence of any a-axis aligned grains.

The improved electrical transport properties of the invention are achieved by processing the metal oxyfluoride film into an oxide superconductor under reaction conditions which control the reaction kinetics of the process and the microstructure of the resultant oxide film. In particular, reaction conditions are selected which control the rate of consumption of $BaF_2$ and/or other metal fluorides and thus the HF evolution rate which among other effects permits sufficient time for the transport of HF from the film and which also reduces the HF concentration during the nucleation of the oxide superconductor layer at the substrate/film interface.

The control of metal fluoride consumption in the film may have several advantageous effects in the production of a highly aligned oxide superconductor film. A reduced consumption rate of $BaF_2$ in a YBCO film, for example, will reduce the presence of HF in the vicinity of the substrate and/or dissolved HF in the film itself. HF is reactive with many substrates and may etch the substrate surface. Etching can cause substrate roughening. Unevenness of the substrate surface has been associated with the preferential growth of a-axis aligned grains. See, McIntyre et al. *J. Crystal Growth* 149:64 (1995). Further, the presence of dissolved HF or fluoride ion in the film may deleteriously affect the nucleation kinetics of the oxide superconductor at the substrate. Therefore, a reduction in the HF concentration during conversion process may serve to reduce substrate etching and/or improve the nucleation of the oxide superconductor at the substrate surface to thereby improve the microstructure of the oxide superconductor.

Conventional processes have used the reaction temperature to control the rate of $BaF_2$ consumption. The prior art stresses the importance of high moisture content in the processing gas during the removal of fluorine from the oxyfluoride films. A high $P_{H2O}$ is expected to drive the hydrolysis reaction forward. Thus, in conventional processes, the moisture content during conversion of the oxyfluoride film into epitaxial oxide superconductor is kept as high as is practical, and the conversion rate is controlled by temperature. However, temperature affects other aspects of the conversion process such as the growth kinetics of the oriented oxide superconductor grains. The present invention has recognized that it is possible to use the moisture content of the processing gas as a rate controlling parameter in addition to temperature. Temperature may then be selected, for example, to favor the growth of oriented, dense oxide superconductor films. The cooperative selection of temperature and $P_{H2O}$ gives the process more flexibility and provides a route to higher quality films.

The present invention has identified moisture content as an additional processing variable which may be regulated in order to manage reaction rates during the conversion of metal oxyfluoride into oxide superconductor. Thus, the practitioner wishing to control the rate of $BaF_2$ consumption now has the option of either lowering the temperature or, for a given temperature, reducing the amount of water vapor in the processing gas. This additional option is particularly valuable since it is recognized that temperature plays a role in grain growth and film density. Higher temperatures lead to more dense films, which typically exhibit better current transport. Reaction at higher temperatures would not be available in the prior art for thick films (using process gas saturated with water vapor at room temperature) because an increase in temperature would result in an undesirable rate of $BaF_2$ consumption. For example, it has been observed that when processing thick films under processing gas saturated with water vapor at room temperature, higher processing temperatures, e.g., 835° C. for YBCO, produced films which were dense, but which contained an unacceptably high level of a-axis oriented grains. Critical current density values of these films were poor, e.g., less than 25,000 $A/cm^2$.

The present invention permits the selection of reaction temperature so as to obtain desirably dense films or other such consideration, while at the same time controlling the rate of $BaF_2$ by providing the additional processing variable of moisture content control. The present invention further identifies the interdependency of the conversion process on the reaction temperature and the water vapor pressure and provides guidance as to the relative levels of each which is desirable in order to obtain a thick film possessing superior electrical properties.

In addition to selection of $P_{H2O}$ and T, oxygen pressure ($P_{O2}$) is selected to maintain processing conditions in a regime where YBCO is thermodynamically stable. Details of the effects of varying oxygen levels in the processing environment for a given temperature is given in further detail in the Doctoral Dissertation of Paul C. McIntyre, Massachusetts Institute of Technology, June, 1993, entitled "Heteroepitaxy Growth of Chemically Derived $Ba_2YCu_3O_{7-x}$ Thin Films", and in U.S. Pat. No. 5,231,074, which are hereby incorporated by reference. However, one of the advantages of the present invention is that proper selection of the temperature and water vapor pressure does not require that the reaction be carried out substantially close to the $Cu^{2+}/Cu^+$ stability line, as had previously been the case. Note for example in FIG. 5, a one micron thick YBCO film was obtained well above the $Cu^{2+}/Cu^+$ stability line having a critical current density of $10^6$ $A/cm^2$. In general, it is desirable that a relative increase in reaction temperature is carried out in conjunction with a relative increase in oxygen pressure. In preferred embodiments, the oxide superconductor is formed in a temperature range of 700–900° C., preferably in a temperature range of 700–835° C., and in 0.01–10 vol % $O_2$. For example, YBCO may be formed at 835° C. in an oxygen atmosphere of about 1.0% $O_2$; and YBCO may be formed at 785° C. in an oxygen atmosphere of about 0.1% $O_2$.

Thus, by way of example only and in accordance with the method of the invention, a metal oxyfluoride film may be converted into a high quality YBCO film of greater than 0.5 $\mu$m by heating at 785° C. in a moist atmosphere a relative humidity of about 1.2% as determined at 25° C. Alternatively, a high quality YBCO film with thicknesses greater than about 0.5 $\mu$m may be obtained by heating at 835° C. in a moist atmosphere having a relative humidity of about 0.6% at 25° C. Oxygen partial pressure is selected as described above to favor thermodynamically the formation of the oxide superconductor.

Further, it has been observed that the temperature and moisture content suitable to provide a superconducting thick film may vary with film thickness. Thus for a given reaction temperature, an oxyfluoride film having a thickness of about 1.0 $\mu$m desirably is treated in a processing gas having a lower moisture content than a comparable film having a thickness of about 0.5 $\mu$m. It is contemplated that films with thicknesses considerably greater than 1.0 $\mu$m may be prepared with proper adjustment of the moisture content of the processing gas to lower levels.

The realization that the processing conditions used to form the oxide superconductor should be selected so as to provide rate control over the conversion step is contrary to all teachings in the prior art, which advocate rapid conversion of the metal oxyfluoride film into BaO and HF. The prior art typically teaches the use of processing gas saturated with water vapor at room temperature (typically close to 100% RH at RT). In contrast, the present invention identifies an additional processing variable, the moisture content in the processing gas, which may be reduced so as to allow for kinetic control of the conversion step.

The actual amount of moisture appropriate in the injected processing gas is a function of the reaction temperature. At relatively higher processing temperatures, the appropriate moisture content of the injected processing gas is relatively less. The moisture content is measured at room temperature before the gas enters the heating chamber (furnace) containing the coated substrate. Moisture content of the processing gas at room temperature is typically less than 100% RH, preferably less than about 10% RH, and is more preferably less than about 2% RH. There may be a lower limit for the $P_{H2O}$ of the system, as well, below which the reaction will not spontaneously proceed. The exact value may be determined by reference to thermodynamic stability of the reactants or products. Alternatively, it may be determined empirically by lowering the $P_{H2O}$ at a given temperature until the reaction no longer proceeds. Additionally, appropriate moisture levels may be well above such lower limits, since the processing time may be too lone otherwise.

An additional feature of the method of the invention is that control of $BaF_2$ consumption also controls the rate of HF formation. Hydrogen fluoride is generated during hydrolysis of metal fluorides, in particular barium fluoride, in a reaction which also generates the corresponding metal oxides. In one embodiment of the invention, HF concentration in the furnace above the substrate is estimated to be at or below 500 parts per trillion. One technique for maintaining the partial pressure of HF at a low level is to rapidly flush the processing gas through the furnace in which the coated sample is being heat treated. However, this may result in a loss of control over other processing variables, such as furnace and sample temperature. A preferred approach for maintaining a low $P_{HF}$ is to control the rate of hydrolysis. One technique is to reduce the reaction temperature so as to slow down the overall reaction rate with the concomitant reduction in HF production. Another technique is to control the amount of moisture in the processing gas, the only significant source of water in the hydrolysis process. Thus, the hydrolysis reaction may be controlled, and hence the generation of HF may be regulated, by restricting the moisture content of the processing gas. By maintaining the water content of the processing gas below a predetermined level such that water is the rate limiting reagent, the rate of HF generation may be regulated.

In one embodiment of the invention, the combination of a sufficiently low moisture processing gas, sufficiently low reaction temperature, and high enough processing gas flow rate is used to ensure that partial pressure of HF is estimated to be in the hundreds of parts per trillion. The combination of low moisture content and low reaction temperature produce a slow reaction rate and therefore the production of HF is also low. As stated above, processing gas moisture content at the inlet to the furnace is 1.2% and 0.6% at room temperature, respectively, for reaction temperatures of 785° C. and 835° C., respectively. Processing gas flow rates may be about 3 L/min through a 5 cm ID quartz furnace tube giving a space velocity of about 150 cm/min; however, flow rates are expected to vary with furnace size and configuration.

The exact conditions employed to obtain the final oxide superconductor film are dependent upon the nature of the metalorganic precursors and the final oxide superconductor. In particular, the particular temperature, atmosphere, heating rate, etc., will be material-sensitive, however, exact conditions may be readily determined by practice of the invention as described herein.

Figure 6A:
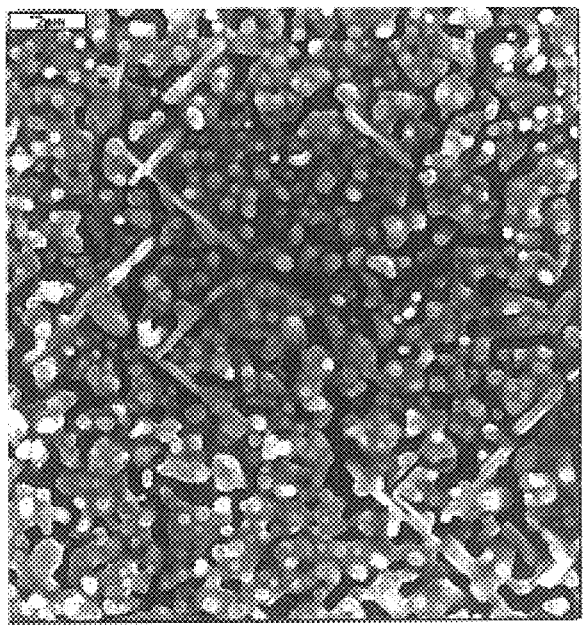
FIG. 6 are photomicrographs of oxide superconductor films processed to obtain a low density (a) or a high density (b) film.
Figure 6B:
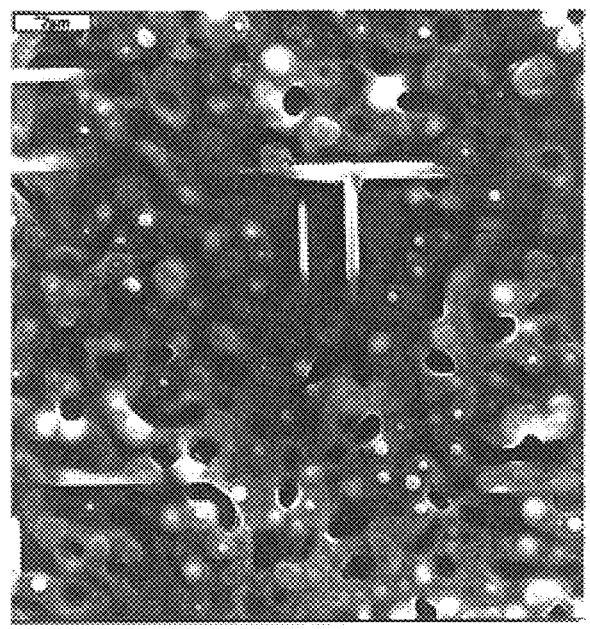

The method of the invention may be used to control the density of the resultant oxide superconductor films. The growth kinetics of the oxide grains improve with increasing temperature. Thus, high density films may be obtained by heating at high temperatures. Processing at higher temperatures may also substantially increase the average grain size of the film. Because increasing the processing temperatures also increases the reaction rate of water with $BaF_2$, the moisture level in the processing gas needs to be accordingly reduced in order to maintain the desired low rate of $BaF_2$ consumption. The effect of these processing modifications are seen in comparing the photomicrographs of YBCO oxide superconductor films of FIG. 6. The film in FIG. 6A was processed in 1.2% RH(RT) moist nitrogen/oxygen atmosphere containing 0.1% $O_2$ at 785° C. (Example 2). The film in FIG. 6B was processed in 0.6% RH(RT) moist nitrogen/oxygen atmosphere containing 1.0% $O_2$ at 835° C. (Example 3). Both films have a critical current density of about $10^6$ $A/cm^2$ at one micron thick; however, the microstructures differ significantly. The film of FIG. 6A is considerably more porous than that of FIG. 6B. The increased grain growth at higher reaction temperatures results in denser films.

Figure 7:
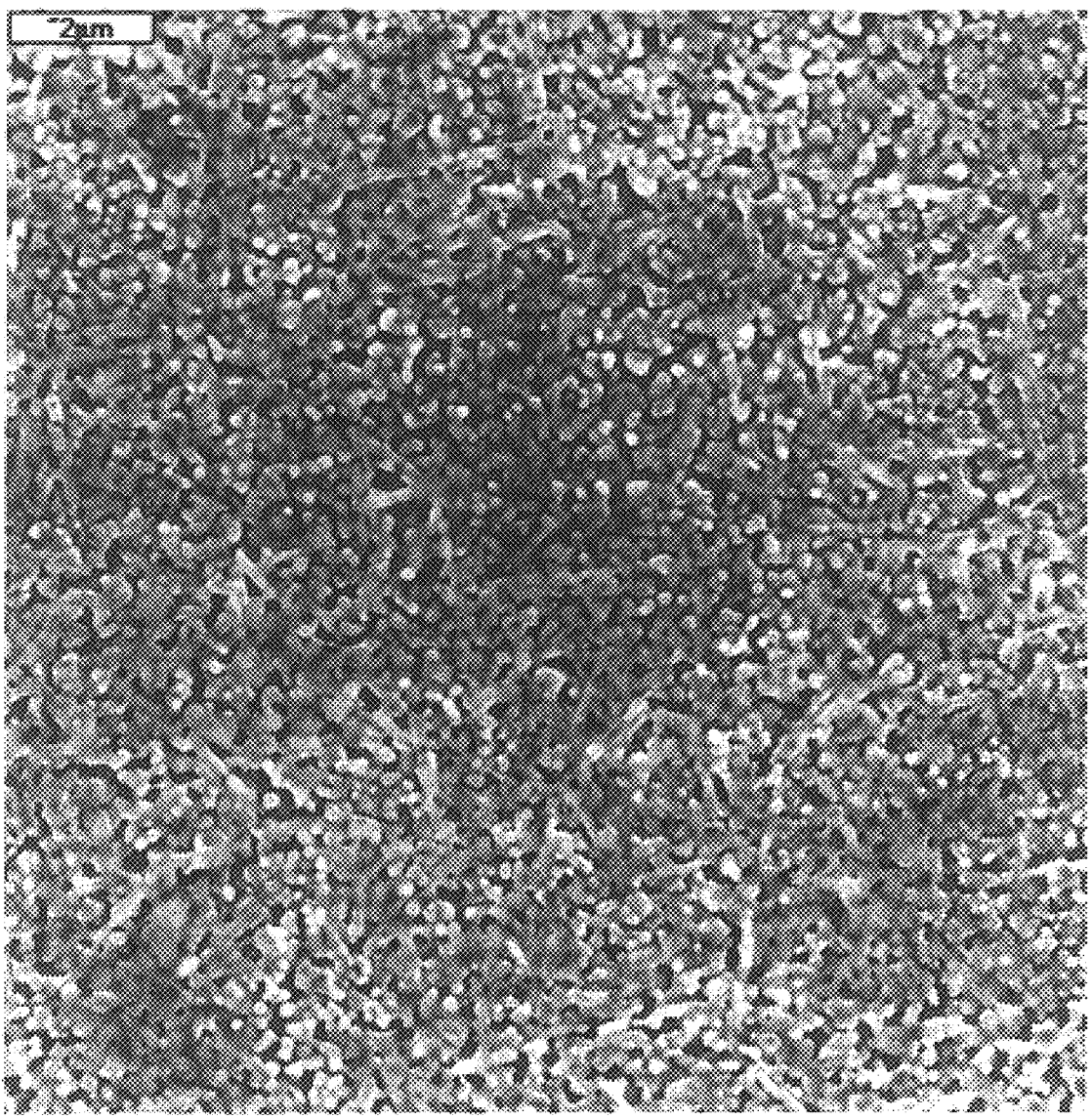
FIG. 7 is a photomicrograph of an oxide superconductor film processed under reduced temperatures.

According to the method of the invention, temperature may be lowered sufficiently to permit the use of a water saturated processing gas, yet to still obtain oxide superconducting thick films having the superior electrical transport properties of the invention. The method of the invention may include processing at reduced temperatures. Because the lower reaction temperatures reduce reaction rate and thus also the generation of HF, the reaction may be carried out with or without reduced moisture in the processing gas. As can be expected, especially in light of the comments immediately preceding regarding reaction temperature, reaction at lower temperatures results in a more porous film. FIG. 7 is a photomicrograph of a 1 $\mu$m thick YBCO oxide superconductor film processed at 700° C., in 0.01% vol. $O_2$ processing gas saturated with moisture at room temperature (Example 1). There is no noticeable a-axis epitaxy of the oxide superconductor grains; however, consistent with the observations above, the film is noticeably more porous than films processed at higher temperatures. Importantly, the film had a critical current density of $4.0\times10^5$ $A/cm^2$, which exceeds prior art performance for oxide superconductor films of comparable thickness.

Figure 8:
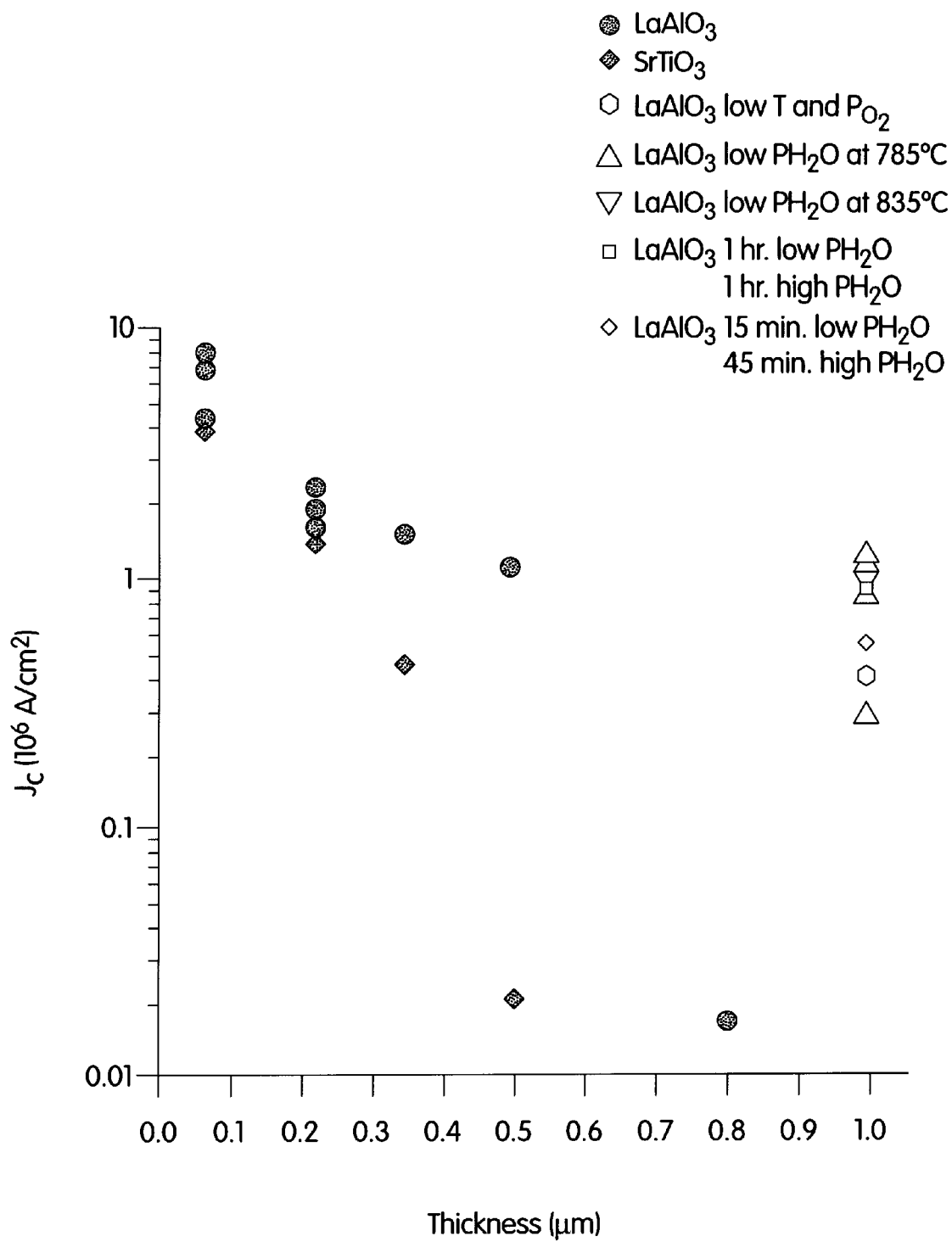
FIG. 8 is a plot of $J_c$ vs. film thickness for a variety of oxide superconductor films.

FIG. 8 is a plot of critical current density vs. film thickness for $Ba_2YCu_3O_{7-x}$ samples which were treated in a variety of ways. Solid data points represent samples deposited on various lattice-matched substrates which were prepared under processing gas saturated with moisture at RT. The electrical performance of these conventionally processed samples drops off dramatically for samples with film thicknesses greater than 0.3 $\mu$m (see, FIG. 8). Open data points represent samples deposited on $LaAlO_3$ substrates which were processed according to the method of the invention. These films exhibit critical current densities greater than the prior art thick film samples, even in films with thicknesses as great as one micron (see, FIG. 8).

It is contemplated that any means of deposition of a metal oxyfluoride film may be used in accordance with the invention. Chemical and physical deposition techniques are contemplated as being within the scope of the invention, such as but not limited to, MOD, MOCVD, physical sputtering techniques, such as reactive evaporation, magnetron sputtering, e-beam evaporation and laser ablation. Thus, metal oxyfluoride films may be deposited by MOD as described above, or they may be deposited by MOCVD and then treated with the low moisture heat treatment of invention. Typically, in an MOCVD process, high vapor pressure sources of the constituent metal species, e.g., copper and yttrium and a metal fluoride, e.g., barium fluoride or yttrium fluoride, are introduced into a chemical deposition chamber where they are deposited on the substrate. The as-formed film may be heat treated according to the method of the invention to form the oxide superconductor.

It is further contemplated that a hybrid method including the ex situ annealing of metal oxyfluoride films deposited by physical deposition methods, may also be employed in the practice of the present invention. This allows for the separation of the film deposition step from the step of conversion into an oxide superconductor, providing better control of the individual steps and a potential for higher performance and productivity. Typically, independent sources of CuO, $Y_2O_3$, and $BaF_2$ are used as targets in e-beam evaporation, with the deposit rate adjusted so as to deposit an amorphous film of the correct stoichiometry. The film may be heat treated according to the method of the invention, resulting in removal of fluorine by reaction with water and subsequent crystallization of the film on an epitaxial substrate. Further annealing in pure oxygen at lower temperature produces the superconducting phase $Ba_2YCu_3O_{7-x}$ (YBCO).

In another embodiment of the invention, a metal oxyfluoride film is processed in a low moisture environment for a time sufficient to nucleate and grow a thin layer of the oxide superconductor at the substrate/film interface. The precise thickness of this layer is not known, however, it is estimated to be on the order to tenth (0.1) to hundredths (0.01) of a micron thick. Thereafter, the amount of water vapor in the processing gas is increased and is preferably increased up to the saturation point. The process is continued until conversion of the metal oxyfluoride into the oxide superconductor is complete. While not being bound by any particular mode of operation, the presence of the initial oxide superconducting layer may prevent substrate etching by any HF retained in the film itself and/or above the substrate. Alternatively, the reduced HF content within the oxyfluoride film may favor c-axis orientation. Once an oriented layer is formed on the substrate, orientation of the subsequent oxide superconductor may not be dependent upon HF concentration. For a low moisture heat treatment at 835° C., 1.0% $O_2$ and 0.6% RH at RT, it has been observed that a sufficient layer is formed by treating for 15 min. to one hour (Examples 4 and 5). It is contemplated that the heat treatment may be longer or shorter, dependent upon other reaction conditions, most notably temperature; however, in preferred embodiments, the combined heating time for the first low moisture step and the second high moisture step typically is less than the time required when using solely a low moisture heat treatment.

Regardless of the mode of operation and as demonstrated in Examples 4 and 5, once the initial layer is formed, the water content of the processing gas may be increased without harm to the forming oxide superconductor film. Use of the low moisture process only to form an oxide superconductor initial layer may be desirable for reducing processing time due to the rate limiting nature of the low moisture process of the invention.

Investigations by the present applicants have established that a surprising amount of hydrogen fluoride is desorbed from the furnace Glassware under conventional processing conditions. This hydrogen fluoride had presumably been adsorbed by the furnace glassware during earlier film processing experiments. It is not readily apparent whether improved electrical performance is the result of a decreased rate of HF formation, $BaF_2$ consumption or BaO formation, or because the $P_{HF}$ of the system is reduced. The rate of hydrolysis and the rate of oxide superconductor formation may depend on many factors, such as mass transfer limitation within the film, $BaF_2$ crystallite size, etc.

While not being bound to any particular theory of operation, it is hypothesized that evolution of HF by the furnace glassware exacerbates substrate etching which is detrimental to film quality. Many substrates suitable for growing oxide superconductor films are susceptible to HF etching. The higher the HF concentration in the furnace, the greater the substrate etching. HF etching of the substrate causes surface defects or steps which create more sites for a-axis growth on the substrate (See, McIntyre et al., supra). This hypothesis is consistent with many of the observed phenomena of the process.

The hypothesis may explain why prior to the invention described herein thin films of high superconducting quality could be produced while fabrication of thicker films was problematic. In the fabrication of thin films, much less metal oxyfluoride is deposited on the substrate surface and, therefore, the hydrolysis reaction generates much less HF. In addition, the diffusion length for the HF through a thicker metal oxyfluoride layer is greater than through a thinner layer. Less HF in the furnace atmosphere and/or in the oxyfluoride film means less surface etching and, hence, less a-axis oxide grain growth. Thicker films under uncontrolled reaction conditions will generate a larger amount of HF and retain a given amount for a longer time which can significantly etch substrate surface. It has previously been observed that surface defects promote undesirable a-axis epitaxial oxide grain growth.

The hypothesis further explains the substrate dependency observed when fabricating films with the conventional process. Note that the performance of conventionally produced films on $SrTiO_3$ substrates is more adversely affected by thickness than conventionally produced films on $LaAlO_3$ substrates (FIG. 8). Some substrates, e.g., $SrTiO_3$, are expected to be more sensitive to HF etching or reaction than other substrates, e.g., $LaAlO_3$. Thus, during conventional processing where significant amounts of HF are being generated, those substrates that are particularly sensitive to HF etch will degenerate more significantly than those that are less sensitive. In contrast, it is expected that HF etching of the substrate would be considerably lessened in processing according to the present invention, since HF partial pressures are being maintained at lower levels during and prior to nucleation of the superconducting oxide at the substrate film interface.

The invention may be described by way of the following examples which are presented for the purposes of illustration and which are in no way intended to be limiting of the invention, the full scope of which is set forth in the claims which follow.

Prior to describing the details of each example, a general description of the sample preparation, processing equipment and protocol, and heat treatments used is given. This general description applies to all the examples.

Sample Preparation.

Samples were prepared by coating polished single crystal $LaAlO_3$ substrates with a liquid solution of the mixed-metal trifluoroacetates (Ba, Y, and Cu in the relative metal molar concentrations of 2, 1, and 3, respectively) and methanol.

The liquid solution for spin coating was prepared by reacting the metal (Ba, Y, Cu) acetates and trifluoroacetic acid in water, drying the product to a semisolid (glassy) state and then redissolving the product in methanol. Stoichiometric quantities of the metal acetates and trifluoroacetic acid were used, presumably resulting in final solution of mixed-metal trifluoroacetates in methanol in which the metal ratio Ba:Y:Cu is 2:1:3.

The substrates were obtained by sectioning larger $LaAlO_3$ single crystal substrates with a diamond wire saw. The substrates were 0.020" thick and typically approx. ¼"×¼" although it is clear that any size substrate, even long wires or tapes will benefit from the method of the invention.

Prior to spin coating, the substrates were cleaned chemically and mechanically. They were ultrasonically cleaned in chloroform, acetone and methanol, respectively, and then wiped with a low lint tissue moistened with methanol. The substrates were examined optically under 50X magnification after wiping. Rewiping was performed as necessary to remove any residual dust or contamination. If repeated wiping did not succeed in removing contamination, the entire cleaning process was repeated.

The coating was obtained by spin coating using a photoresist spin coater in a particulate containment hood under conditions in which the temperature in the hood was close to room temperature and the humidity in the hood was kept substantially below 50% RH. The unfired films were observed to quickly dewet from the substrate material when exposed to moist room temperature air (e.g., greater than 50% RH).

The samples were then loaded into the furnace and placed into the processing zone. The sample loading procedure exposed the samples to unfiltered room air for only a few seconds.

Processing Equipment and Protocol.

The furnace architecture for all the processing steps used to convert the spun films into the superconducting films was a horizontal split type. The architecture used for the processing step that converted spun films into oxyfluoride films incorporated precise temperature control tailored for relatively low temperature parts of the heat treatment.

The temperature controlled sections of the main furnace tube, tube liner and furnace furniture were all fabricated from silica glass. The furnace furniture consisted of a tube with a D-shaped cross-section ("D-tube") having a movable silica plate on top.

Furnace gas flow rate control for the processing step that converted spun films into oxyfluoride films was provided by using a manually controlled flow meter and regulated gas pressure. Dry and moist Ultra High Purity (UHP) molecular oxygen gas was used. The injected furnace gas was switched from dry to moist during an initial fast heating ramp rate period. The switch to moist gas was made after approximately 13 minutes into the initial fast heat up period. A volumetric flow rate of 10±1 scfh was used for the dry molecular oxygen, and a volumetric flow rate of 8±1 scfh was used for the moist molecular oxygen. The diameter of the main furnace tube was 5 cm. The distance from the gas inlet to the processing zone was approximately 1.1 m. Moist furnace gas was obtained by passing the furnace gas through purified water at room temperature, until saturated (in the range of approximately 95–100% RH at RT) prior to injection into the processing environment.

Furnace furniture temperature was monitored with a stainless steel sheathed thermocouple probe (0.032" diameter) with the probe tip placed between the sample positions. This temperature measurement probe was an ungrounded type K thermocouple probe (purchased from Omega Co.). The probe was positioned in direct contact with the furnace furniture, on the side of the furniture's movable plate upon which samples were placed.

The furnace architecture for the part of the processing that converted the oxyfluoride films into the oxide films was similar to the system described above, with the following exceptions. The temperature control performance was tailored for better high temperature control and the length of the tube upstream of the sample was approximately 0.6 m. Also the thermocouple used for measuring the sample temperature was 0.062" in diameter and Inconel sheathed. It was positioned with the tip near but downstream of the sample positions in a closed end high purity $Al_2O_3$ protection tube which was in direct contact Faith the furnace furniture, on the side of the furniture's movable plate upon which samples were placed. Low $P_{O2}$ furnace gas for the high temperature heat treatments were prepared using electronically controlled mass flow controllers to mix ultrahigh-purity nitrogen with analyzed oxygen/nitrogen gas mixtures prior to injection into the processing environment. The total flow rate of gas through the furnace was kept at 3.0 L/min., for the low $P_{O2}$ portion of the heat treatment. A flow rate of 4 scfh was used for the 100% $O_2$ portion of the heat treatment. This flow rate was provided using a manually controlled flow meter and regulated gas pressure.

Figure 9:
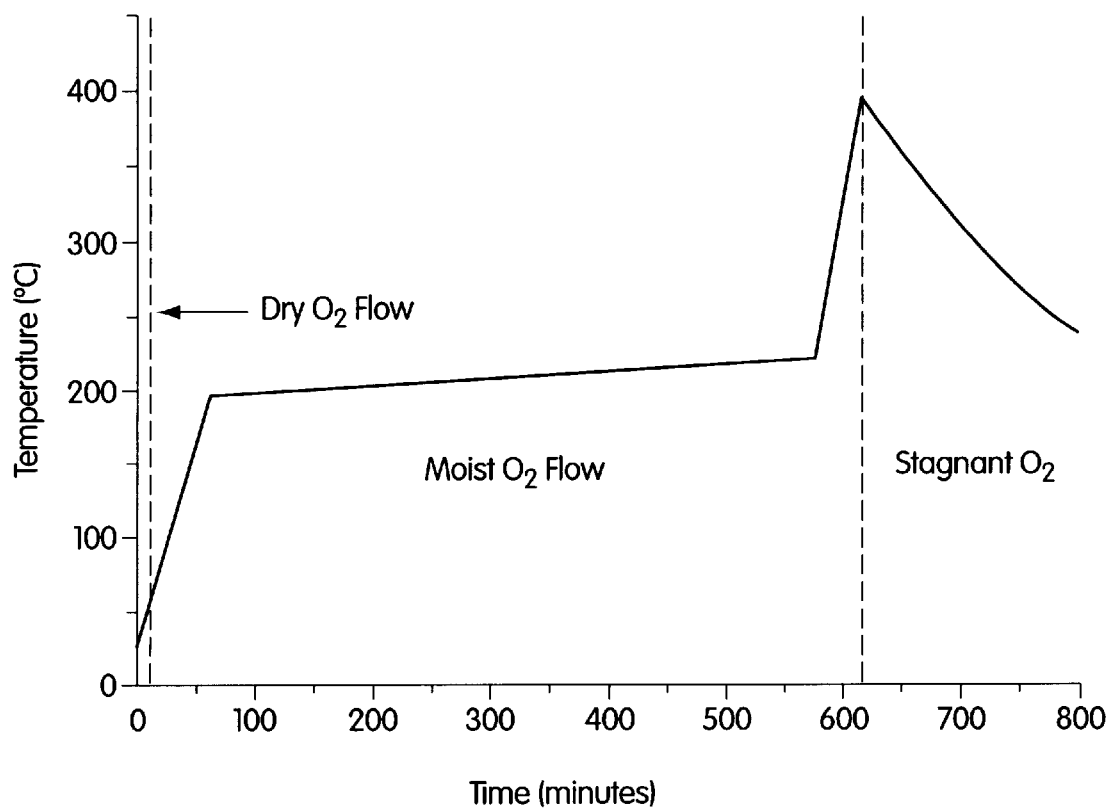
FIG. 9 is a temperature-time profile of a typical low temperature heat treatment for the MOD preparation of a metal oxyfluoride film.

Heat treatment. The samples were heated treated in two stages. Metal oxyfluoride films were produced by heating according to the heat treatment profile shown in FIG. 9. Although the switch from dry to moist oxygen was done at about 13 minutes into the initial heat up, due to a lag in the heat up of the furnace furniture with respect to the heat up of the furnace heating elements, the sample temperature was only approximately 50° C. at that point. The moist gas was used to suppress volatilization of copper trifluoroacetate; however, the unfired films quickly dewet from the substrate when exposed to the moist furnace gas at a low temperature. Switching from the dry to the moist processing environment when the furnace furniture was approximately 50° C. was found to sufficiently address both of these issues, given the equipment and process design used. The flow of humid oxygen was maintained until the temperature reached the peak value for this part of the process (approximately 400° C.), at which point the furnace power and the flow of gas were shut off. The furnace was then allowed to cool with the samples in the stagnant, humid oxygen.

The oxyfluoride films obtained from decomposition of the metal trifluoroacetates were subsequently converted to $Ba_2YCu_3O_{7-x}$ by annealing at temperatures in the range of 700–835° C. in environments of controlled $P_{O2}$ and $P_{H2O}$.

Details of processes for this subsequent conversion to $Ba_2YCu_3O_{7-x}$ are given in the following examples.

EXAMPLE 1

This experiment describes the preparation of YBCO oxide superconductor thick films from TFA precursors by using a relatively low annealing temperature.

Figure 10:
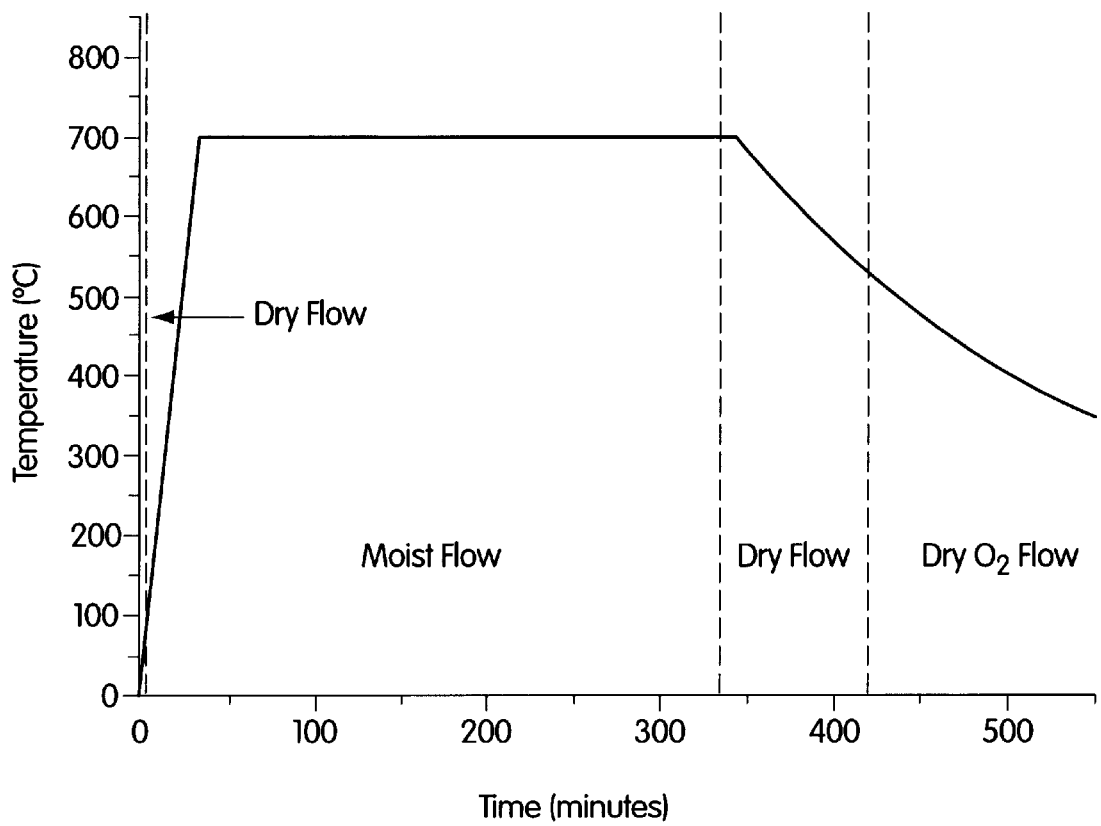
FIGS. 10–14 are temperature-time profiles, based on key monitored values of high temperature heat treatments for the MOD preparation of oxide superconductor films.

During this heat treatment (see FIG. 10), dry, 0.01% $O_2$ gas mixture was injected into the processing environment for the first three minutes of the initial temperature ramp up. Due to a lag in the heat up of the furnace furniture with respect to the heat up of the furnace heating elements, the sample temperature was still approximately room temperature at this point. Then the incoming gas was switched to high moisture (in the range of approximately 95–100% RH at RT) 0.01% $O_2$ gas mixture. The humid, low $P_{O2}$ atmosphere was passed over the sample throughout the remainder of the heat up and high temperature hold until the last 10 minutes of the high temperature hold. The hold temperature was 700° C. (rounded to the nearest 10° C. and with an initial overshoot of approximately 10° C). With 10 minutes remaining in the high temperature anneal, flow of the dry low $P_{O2}$ gas mixture resumed. Following this dry purge at the annealing temperature, the dry gas mixture flow was maintained as the samples cooled until the furnace furniture temperature was about 525° C., at which point the flow was switched to dry oxygen and the furnace was allowed to cool to room temperature.

The sample obtained by this procedure had a 1.0 micron thick oxide superconductor layer. Critical current density was measured using a 1 $\mu$V/cm criterion. The film possessed a critical current density ($J_c$) of $0.4 \times 10^6$ A/cm$^2$.

EXAMPLE 2

This experiment describes the preparation of YBCO oxide superconductor thick films from TFA precursors by annealing in low moisture. Low moisture gas was prepared by precisely blending high moisture gas with dry gas using a high precision manual flow meter just prior to injection into the processing environment.

Figure 11:
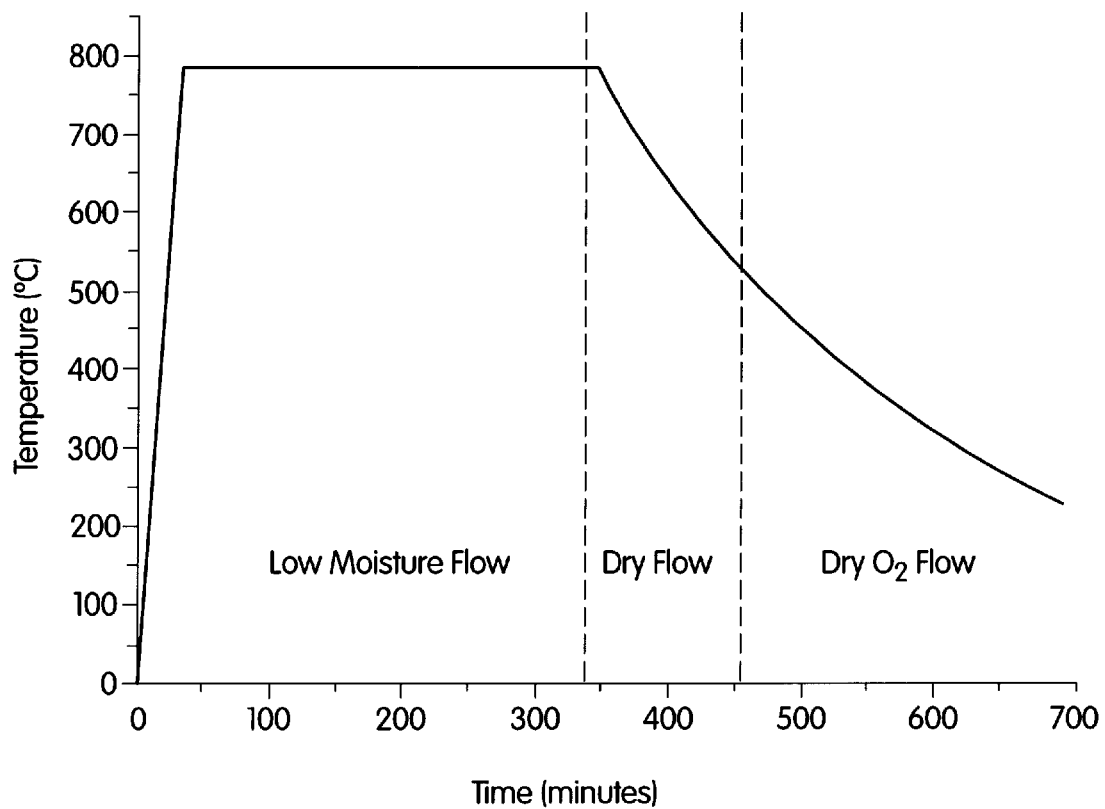

The sample preparation and furnace apparatus was as described in Example 1, with the following modifications. Low moisture 0.1% $O_2$ gas mixture was injected from the start of the heat treatment until the last 10 min. at the annealing temperature, at which point dry 0.1% $O_2$ gas mixture was injected. The moisture level of the humid gas mixture used was 1.2% RH at RT. The annealing temperature was 785° C. (rounded to the nearest 5° C. and with no substantial overshoot). This heat treatment for this example is shown in FIG. 11. The film possessed a critical current density ($J_c$) of $1.1 \times 10^6$ A/cm$^2$.

EXAMPLE 3

This experiment also describes the preparation of YBCO oxide superconductor thick films from TFA precursors by annealing in low moisture.

Figure 12:
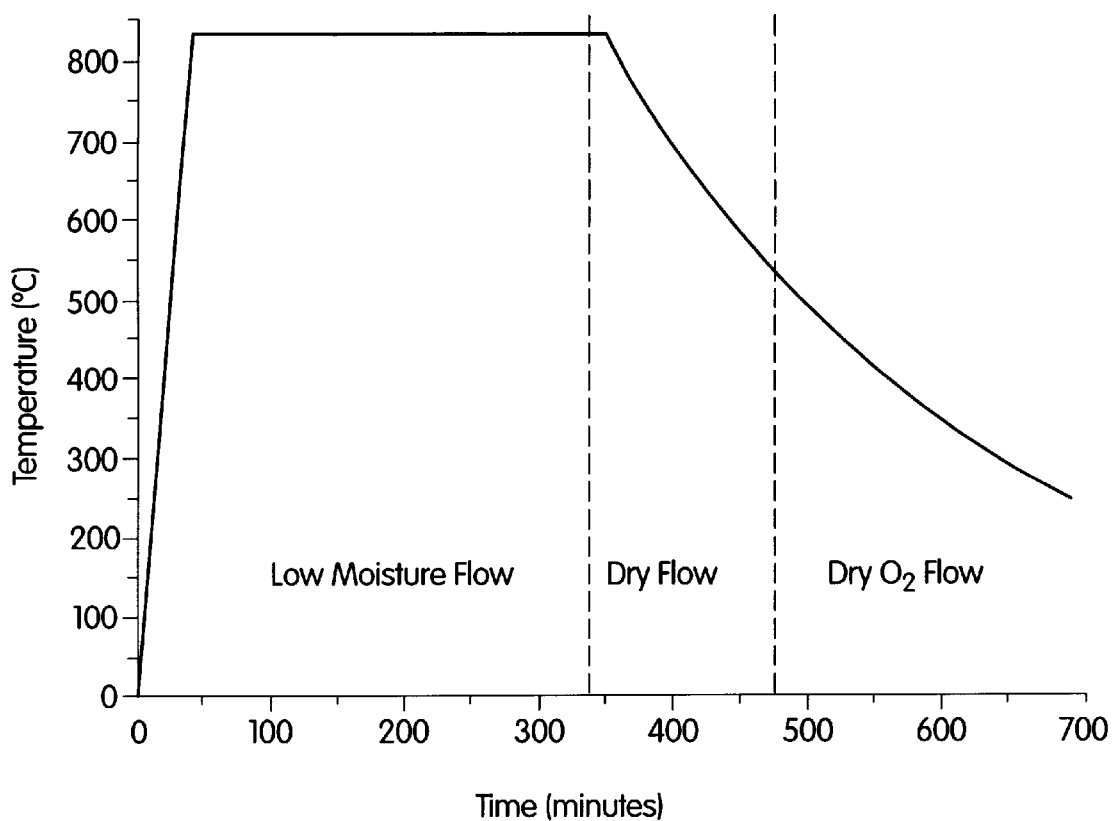

The sample preparation, furnace apparatus, and heat treatment was as described in Example 2, with the following modifications. The annealing temperature was 835° C. (rounded to the nearest 5° C. and with no substantial overshoot), the moisture level was 0.6% RH at RT, and the $P_{O2}$ level was 1.0%. The heat treatment for this example is shown in FIG. 12. The film possessed a critical current density ($J_c$) of $1.0 \times 10^6$ A/cm$^2$.

EXAMPLE 4

This experiment describes the preparation of YBCO oxide superconductor thick films using the formation of an oxide superconductor passivating layer at the substrate to reduce processing time.

Sample preparation, furnace apparatus, and heat treatment as described in Example 3, with the following modifications.

Figure 13:
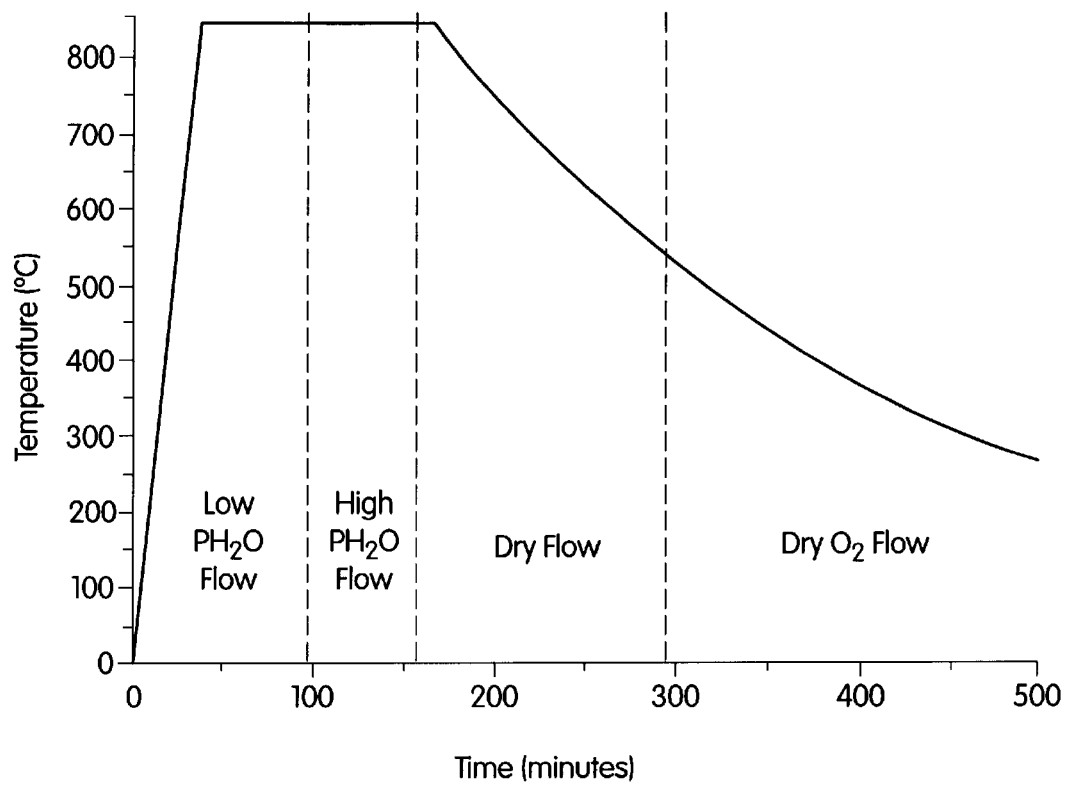

The high temperature anneal consisted of 1 hr. at the low moisture level (0.6% RH at RT), then 1 hr. at the high moisture level (in the range of about 95–100% RH at RT) and then the 10 minute dry purge. The heat treatment for this example is shown in FIG. 13. The film possessed a critical current density ($J_c$) of $0.9 \times 10^6$ A/cm$^2$.

EXAMPLE 5

This experiment describes the preparation of YBCO oxide superconductor thick films using the formation of a oxide superconductor passivating layer at the substrate to reduce processing time.

Figure 14:
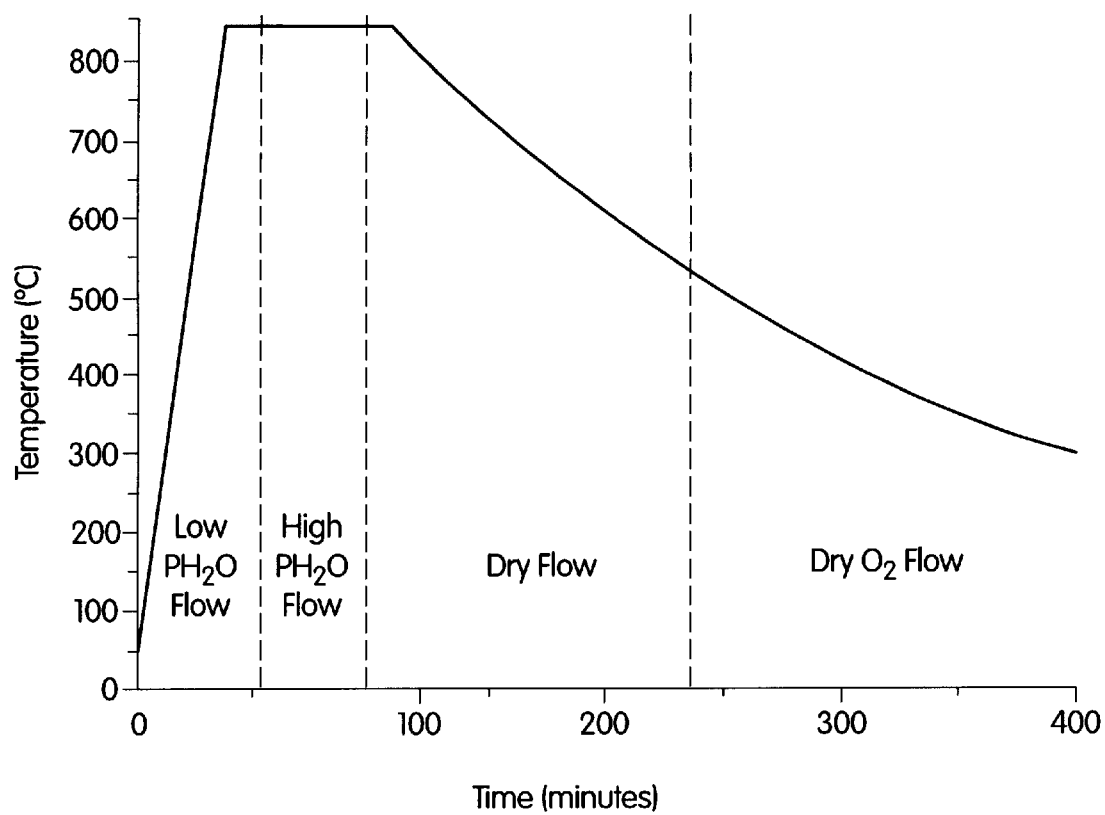

Sample preparation, furnace apparatus, and heat treatment was as described in Example 3, with the following modifications. The high temperature anneal consisted of 15 min. at the low moisture level (0.6% RH at RT), then 45 min. at the high moisture level (in the range of approximately 95–100% RH at RT) and then the 10 minute dry purge. The heat treatment for this example is shown in FIG. 14. The film possessed a critical current density ($J_c$) of $0.5 \times 10^6$ A/cm$^2$.

EXAMPLE 6

This example describes the treatment of a metal oxyfluoride film prepared using conventional PVD methods through heat treatment according to the invention.

Films may be prepared by coevaporation of Y, BaF$_2$ and Cu from three separate sources. The barium fluoride and yttrium may be evaporated using electron beam guns and the copper may be evaporated using a resistively heated source. The three sources may be in triangular configuration with respect to one another and the rates from the sources may be monitored. The background pressure may be about $2 \times 10^{-6}$ torr and during deposition oxygen is introduced into the chamber to deposit an oxyfluoride film resulting in a chamber pressure of about $5 \times 10^{-5}$ torr. The deposition may be continued until a film of desired thickness is obtained.

The thus obtained metal oxyfluoride film may be treated as described in Examples 1–6 to obtain an oxide superconducting film.

What is claimed is:

1. A method for preparing a rare earth-barium-copper oxide superconductor film, comprising:
  providing a metal oxyfluoride film on a substrate, said metal oxyfluoride film having a thickness greater than or equal to about 0.5 $\mu$m and comprising the constituent metallic elements of a rare earth-barium-copper oxide superconductor in substantially stoichiometric proportions; and
  converting the metal oxyfluoride into the oxide superconductor at a rate of conversion selected by adjusting a reaction parameter selected from the group consisting of temperature, $P_{H2O}$ and combinations thereof, such that an oxide superconductor film having a transport critical current density of greater than or equal to about $10^5$ A/cm$^2$ at 77 K, zero field is obtained.

2. A method of preparing a rare earth-barium-copper oxide superconductor film, comprising:
  providing a metal oxyfluoride film on a substrate, said metal oxyfluoride film having a thickness greater than or equal to about 0.5 um and comprising the constituent metallic elements of a rare earth-barium-copper oxide superconductor in substantially stoichiometric proportions; and
  converting the metal oxyfluoride into the oxide superconductor in a processing gas having a moisture content of less than about 100% RH as determined at 25° C.

3. A method of preparing a rare earth-barium-copper oxide superconductor film, comprising:
  providing a metal oxyfluoride film, said metal oxyfluoride film having a thickness greater than or equal to about 0.5 um and comprising the constituent metallic elements of a rare earth-barium-copper oxide superconductor in substantially stoichiometric proportions; and
  converting the metal oxyfluoride into the oxide superconductor under reaction conditions selected to provide an atmosphere above the substrate comprising an HF concentration at a level to provide an oxide superconductor film having a transport critical current density of greater than or equal to about $10^5$ A/cm$^2$ at 77 K, zero field.

4. A method for preparing a rare earth-barium-copper oxide superconductor film, comprising:
  (a) providing a metal oxyfluoride film on a substrate, said metal oxyfluoride film having a thickness greater than or equal to about 0.5 um and comprising the constituent metallic elements of a rare earth-barium-copper oxide superconductor in substantially stoichiometric proportions;
  (b) converting the metal oxyfluoride into the oxide superconductor in a processing gas having a moisture content of less than 100% RH as determined at 25° C. for a time sufficient to form a layer of the oxide superconductor at the substrate/film interface; and
  (c) completing conversion of the metal oxyfluoride into the oxide superconductor in a processing gas having a moisture content greater than that in step (b).

5. The method of claim 4, wherein a time sufficient to form a layer of the oxide superconductor at the substrate/film interface is in the range of about 15 minutes to about 2 hours.

6. The method of claim 2, wherein the oxide superconductor film possesses a transport critical current density of greater than or equal to about $10^5$ A/cm$^2$ at 77 K, zero field.

7. The method of claim 1 or 2, wherein the oxide superconductor film possesses a transport critical current density of greater than or equal to about $10^6$ A/cm$^2$ at 77 K, zero field.

8. The method of claim 1, wherein the moisture content comprises a relative humidity less than about 100% as determined at 25° C.

9. The method of claim 1 or 2, wherein the moisture content comprises a relative humidity less than about 50% as determined at 25° C.

10. The method of claim 1 or 2, wherein the moisture content comprises a relative humidity less than about 3% as determined at 25° C.

11. The method of claim 1 or 2, wherein the moisture content comprises a relative humidity less than about 1% as determined at 25° C.

12. The method of claim 1 or 2, wherein the substrate comprises a metal.

13. The method of claim 1 or 2, wherein the substrate comprises a ceramic.

14. The method of claim 13, wherein the ceramic is selected from the group consisting of SrTiO$_3$, LaAlO$_3$, zirconia, stabilized zirconia, MgO and CeO$_2$.

15. The method of claim 1 or 2, wherein the substrate is substantially lattice-matched with the oxide superconductor.

16. The method of claim 1 or 2, further comprising:
  annealing the oxide superconductor film so as to oxygenate the oxide superconductor.

17. The method of claim 3, wherein conditions for converting the metal oxyfluoride comprise heating the metal oxyfluoride film in a processing gas having a moisture content of less than about 100% RH as determined at 25° C. and at a temperature in the range of 700–835° C.

18. The method of claim 1 or 2, wherein conditions for converting the metal oxyfluoride into an oxide superconductor comprises heating in an environment where oxygen content is selected to be as low as possible at a given temperature while still maintaining stability of the oxide superconductor phase.

19. The method of claim 1 or 2, wherein the metal oxyfluoride film is deposited using metalorganic deposition techniques.

20. The method of claim 1 or 2, wherein the metal oxyfluoride film is deposited using a technique selected from the group consisting of MOD, MOCVD, reactive evaporation, plasma spray, molecular beam epitaxy, laser ablation, ion-beam sputtering and e-beam evaporation.

21. The method of claim 1 or 2, further comprising:

depositing a metal trifluoroacetate coating onto the substrate; and decomposing the metal trifluoroacetate coating to form the metal oxyfluoride film.

22. The method of claim 21, where multiple layers of a metal trifluoroacetate is applied to the substrate.

23. The method of claim 1 or 2, wherein the oxide superconductor film has a thickness of greater than or equal to 0.8 microns.

24. The method of claim 1 or 2, wherein the oxide superconductor film has a thickness of greater than or equal to 1.0 microns.

* * * * *